(12) United States Patent
Micheloni et al.

(10) Patent No.: US 7,366,014 B2
(45) Date of Patent: Apr. 29, 2008

(54) DOUBLE PAGE PROGRAMMING SYSTEM AND METHOD

(75) Inventors: Rino Micheloni, Turate (CO) (IT); Luca Crippa, Busnago (MI) (IT); Roberto Ravasio, Ponte San Pietro (BG) (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/495,876

(22) Filed: Jul. 28, 2006

(65) Prior Publication Data
US 2007/0030732 A1 Feb. 8, 2007

(30) Foreign Application Priority Data

| Jul. 28, 2005 | (EP) | ................................. 05106972 |
| Jul. 28, 2005 | (EP) | ................................. 05106975 |
| Jul. 28, 2005 | (EP) | ................................. 05106976 |

(51) Int. Cl.
*G11C 16/04* (2006.01)

(52) U.S. Cl. ........................... 365/185.03; 365/185.12; 365/185.22

(58) Field of Classification Search ........... 365/185.03, 365/185.12, 185.17, 185.22, 185.28
See application file for complete search history.

(56) References Cited

U.S. PATENT DOCUMENTS

| 5,864,503 | A | 1/1999 | Pascucci et al. |
| 5,933,366 | A | 8/1999 | Yoshikawa et al. |
| 6,058,042 | A | 5/2000 | Nobukata et al. |
| 6,128,229 | A | 10/2000 | Nobukata et al. |
| 6,243,290 | B1 | 6/2001 | Kurata et al. |
| 6,304,486 | B1 | 10/2001 | Yano |

(Continued)

FOREIGN PATENT DOCUMENTS

EP  1 164 597 A  12/2001

(Continued)

OTHER PUBLICATIONS

Seungjae Lee et al., "2.7—A 3.3V 4Gb Four-Level NAND Flash Meory with 90nm CMOS Technology", Solid-State Circuits Converence, 2004, Digest of Technical Papers, ISSCC. 2004 IEEE International San Francisco, CA, USA Feb. 15-19, 2004, Piscataway, NJ, USA, IEEE, Feb. 15, 2004, pp. 52-61.

(Continued)

*Primary Examiner*—Gene N. Auduong
(74) *Attorney, Agent, or Firm*—Graybeal Jackson Haley LLP

(57) ABSTRACT

A method for programming an electrically programmable memory including a plurality of memory cells arranged in individually-selectable memory cell sets each including at least one memory cell. The programming method includes causing the memory cells of a selected memory cells set to be brought into a predetermined, starting programming state. Receiving a target value for the first data bits groups of the memory cells of the selected memory cells set. Receiving a target value for the second data bits groups of the memory cells of the selected memory cells set. After having received the target values of both the first and the second data bits groups, applying to the memory cells of the selected memory cells set a programming sequence adapted to cause the memory cells of the selected memory cells sets to be brought into a target programming state jointly determined by the target values of the first and second data bits groups.

22 Claims, 7 Drawing Sheets

U.S. PATENT DOCUMENTS

| | | | |
|---|---|---|---|
| 6,307,785 B1 | 10/2001 | Takeuchi et al. | |
| 6,483,744 B2 * | 11/2002 | Kim et al. | 365/185.03 |
| 6,496,412 B1 * | 12/2002 | Shibata et al. | 365/185.03 |
| 6,507,514 B1 * | 1/2003 | Tsao et al. | 365/185.17 |
| 6,545,909 B2 | 4/2003 | Tanaka et al. | |
| 6,850,438 B2 * | 2/2005 | Lee et al. | 365/185.11 |
| 7,149,120 B2 * | 12/2006 | Lee et al. | 365/185.22 |
| 2002/0126531 A1 | 9/2002 | Hosono et al. | |
| 2003/0156478 A1 | 8/2003 | Maruyama et al. | |
| 2004/0109362 A1 | 6/2004 | Gongwer et al. | |
| 2004/0190337 A1 | 9/2004 | Chen | |
| 2005/0018488 A1 | 1/2005 | Kim et al. | |
| 2007/0002615 A1 * | 1/2007 | Lee et al. | 365/185.03 |
| 2007/0030730 A1 * | 2/2007 | Bovino et al. | 365/185.2 |
| 2007/0030732 A1 * | 2/2007 | Micheloni et al. | 365/185.03 |

FOREIGN PATENT DOCUMENTS

| | | |
|---|---|---|
| EP | 1 288 964 A | 3/2003 |

OTHER PUBLICATIONS

Ken Takeuchi, et al., "A Multipage Cell Architecture for High-Speed Programming Multilevel NAND Flash Memories", IEEE Journal of Solid-State Circuits, vol. 33, No. 8, Aug. 1998, pp. 1228-1238.

Atsushi Nozoe, et al., "A 256-Mb Multilevel Flash Memory with 2-MB/s Program Rate for Mass Storage Applications", IEEE Journal of Solid-State Circuits, vol. 34, No. 11, Nov. 1999, pp. 1544-1550.

Tae-Sung Jung, et al., "A 117-mm2 3.3-V Only 128-MB Multilevel NAND Flash Memory for Mass Storage Applications", IEEE Journal of Solid-State Circuits, vol. 31, No. 11, Nov. 1996, pp. 1575-1583.

European Search Report for EP 05 10 6972 dated Jan. 18, 2006.
European Search Report for EP 05 10 6976 dated Jan. 16, 2006.
European Search Report for EP 05 10 6975 dated Jan. 26, 2006.

* cited by examiner

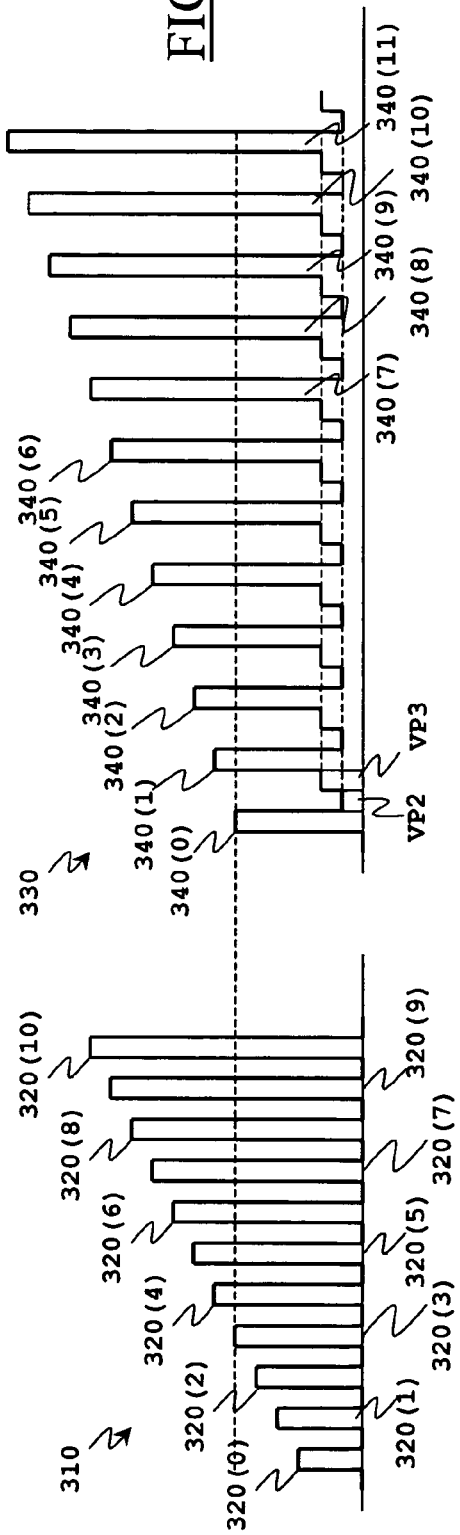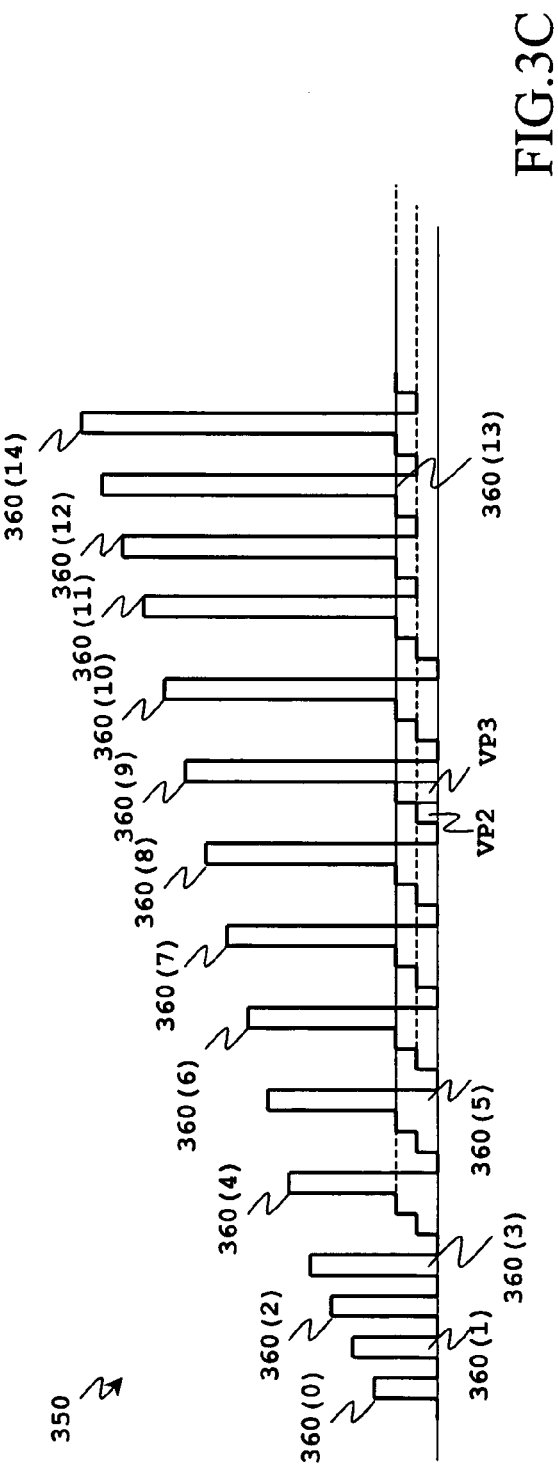

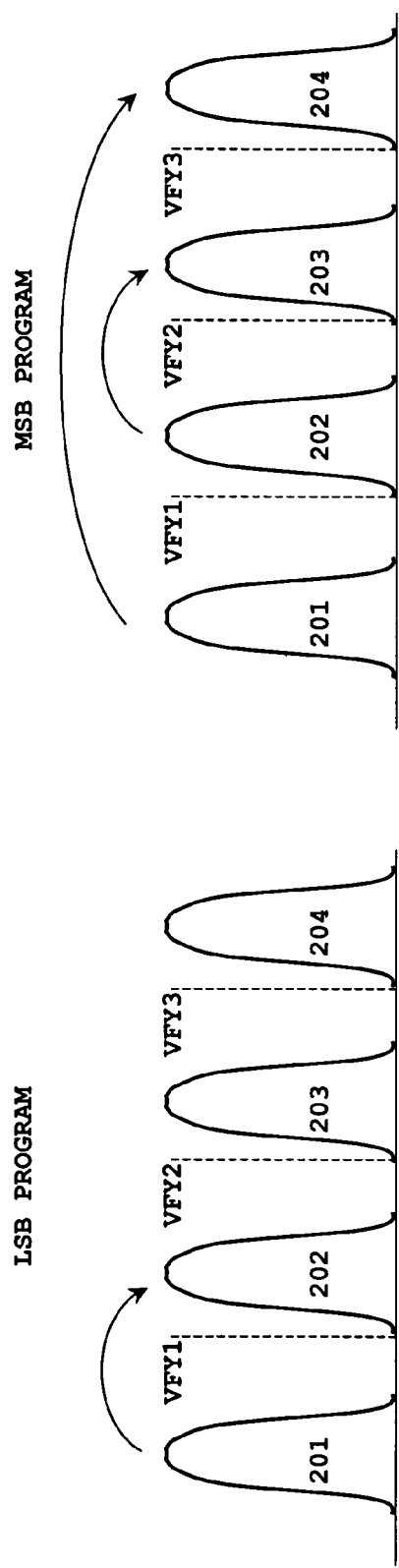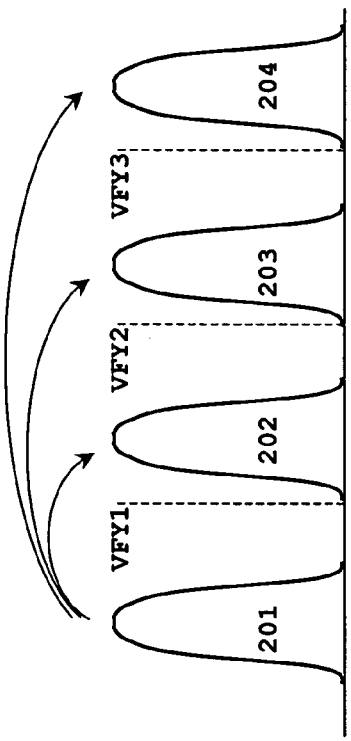
FIG.4A
FIG.4B

DOUBLE PAGE PROGRAMMING SYSTEM AND METHOD

PRIORITY CLAIM

This application claims priority from European patent application Nos. EP05106972.2, filed Jul. 28, 2005, EP05106976.3, filed Jul. 28, 2005, and EP05106975.5, filed Jul. 28, 2005, which are incorporated herein by reference.

CROSS REFERENCE TO RELATED APPLICATIONS

This application is related to U.S. patent application Ser. No. 11/495,875 entitled PAGE BUFFER CIRCUIT AND METHOD FOR MULTI-LEVEL NAND PROGRAMMABLE MEMORIES, and U.S. patent application Ser. No. 11/495,886 entitled NAND FLASH MEMORY WITH ERASE VERIFY BASED ON SHORTER EVALUATION TIME, which have a common filing date and owner and which are incorporated by reference.

TECHNICAL FIELD

The present invention generally relates to the field of solid-state memories, particularly to semiconductor memories and, even more particularly, to the field of non-volatile memories. Specifically, the invention relates to non-volatile memories that are electrically programmable.

BACKGROUND

Non-volatile memories are commonly used in several applications when the data stored in the memory device need to be preserved even in absence of power supply. Within the class of non-volatile memories, electrically programmable (and erasable) memories, such as flash memories, have become very popular in applications in which the data to be stored are not immutable (as it might be case of, e.g., a consolidated code for a microprocessor), being instead necessary from time to time to store new data, or to update the data already stored.

Typically, the memory device includes an arrangement of memory cells, disposed for example in rows and columns, so as to form a matrix.

Depending on the way the memory cells in the matrix are interconnected, two classes of flash memories can be identified: those having a so-called NOR architecture, or NOR flash memories, and those having a so-called NAND architecture, shortly referred to as NAND flash memories. Roughly speaking, in a NOR architecture the memory cells of a same matrix column are connected in parallel to a same bit line, whereas in a NAND architecture groups of memory cells of a same matrix column are serially interconnected so as to form respective strings, which strings are then connected in parallel to each other to a same bit line.

Compared to NOR flash memories, NAND flash memories are more compact (a lower number of contacts in the matrix are required), and they are also better suited for applications such as file storage.

In the NAND architecture, the memory space is ideally partitioned into a plurality of memory pages, each page corresponding to a block of memory cells that, in operation, are read or written simultaneously, i.e. in parallel to each other. The number of memory cells in each block determines the size (i.e., the number of bits) of the memory page. Nowadays, memory pages of 8192 cells are rather typical, but larger memory pages are also encountered, for example of 16384 cells.

Clearly, the memory cannot have so high a number of Input/Output (I/O) terminals as to enable transferring in parallel such long data words; usually, eight or sixteen I/O terminals are in fact provided; thus, some kind of "segmentation" of the memory page is necessary for interfacing the memory with the outside world.

To this purpose, a circuit arrangement called a "page buffer" is provided in the memory for managing the operations of reading the information stored in the memory cells of a selected memory page, or writing new information thereinto. In very general terms, the page buffer includes a buffer register of size equal to that of the memory page, wherein data read (in parallel) from the memory cells of a selected page are temporarily stored, before being serially outputted in chunks of, e.g., eight or sixteen bits, depending on the number of I/O terminals of the memory. Similarly, when data are to be written into the memory, the page buffer is replenished with data received serially in such eight- or sixteen-bits chunks, and, when the buffer has eventually been filled, the data are written in parallel into the memory cells of a given, selected memory page.

The page buffer includes a relatively high number of volatile storage elements, typically bistable elements or latches, in a number corresponding to the number of memory cells of the memory page.

The basic operations that usually are performed on the memory cells are a "page read" (an operation involving reading data from a selected memory page), a "page program" (writing data into a selected memory page), and an "erase" operation, wherein the storing of the memory cells is erased.

So-called "multilevel" memory devices are known, in which each memory cell is capable of storing more than one bit of information. More particularly, referring to the case of memory devices capable of storing a pair of bits of information per memory cell, the latter can be programmed in any one of four different programming states, each one associated with a corresponding logic value of the bit pair. Usually, the programming state of a memory cell is defined by the threshold voltage value of a transistor included in the memory cell; in a memory cell adapted to store two bits, the threshold voltage values of the memory cells may assume one of four different values (or ranges of values). A typical choice is to associate the logic values of the stored bit pair to the states according to a binary sequence "11", "10", "01", "00" corresponding to increasing threshold voltage values, with the logic value "11" that is associated to the state having the lowest threshold voltage value (erased state), and the others associated in succession to states having increasing threshold voltage values. Naturally, for writing data into a two-bit memory cell, or for reading data therefrom, it might be necessary to perform up to three read accesses to the memory cells, using different references.

A solution known in the art for reducing the number of read accesses necessary to retrieve the stored data consists of using a different association rule between logic values and states, that make use of the so called "Gray code." In this way, the logic values are associated to the states according to the binary sequence "11", "10", "00", "01", with the logic value "11" that is associated to the erased state, and the others that are associated in succession to states having increasing threshold voltage values. The main feature of using the Gray code consists in the fact that "adjacent" programming states (in terms of threshold voltage values)

have corresponding logic values that differ from each other by only one bit. This feature implies a series of advantages.

Page buffers using the Gray code that are known in the art are disclosed for example in the U.S. Pat. No. 6,545,909 and in the U.S. patent application Ser. No. 2002/0126531.

In view of the state of the art outlined in the foregoing, the Applicant has faced the problem of how to improve the known solution for managing the operations necessary to the functioning of a multi-level NAND flash memory adopting a Gray coding, particularly under the point of view of the programming of the memory cells.

SUMMARY

According to an aspect of the present invention, a method for programming an electrically programmable memory is provided. The electrically programmable memory includes a plurality of memory cells arranged in individually-selectable memory cell sets each including at least one memory cell, a plurality of distinct memory cell programming states corresponding to a number $N>=2$ of data bits storable in each memory cell. The data bits include at least a first data bits group and a second data bits group. The first data bits groups and, respectively, the second data bits groups stored in the memory cells of one of the individually-selectable memory cell sets form at least a first memory page and a second memory page, respectively, the first and second memory pages being individually addressable.

The programming method includes: causing the memory cells of a selected memory cells set to be brought into a predetermined, starting programming state. Receiving a target value for the first data bits groups of the memory cells of the selected memory cells set. Receiving a target value for the second data bits groups of the memory cells of the selected memory cells set. After having received the target values of both the first and the second data bits groups, applying to the memory cells of the selected memory cells set a programming sequence adapted to cause the memory cells of the selected memory cells sets to be brought into a target programming state jointly determined by the target values of the first and second data bits groups.

Characteristic features of the present invention are set forth in the appended claims. The invention itself, however, as well as further features and advantages thereof will be best understood by reference to the following detailed description, given purely by way of a non-restrictive indication, to be read in conjunction with the accompanying drawings.

BRIEF DESCRIPTION OF THE DRAWINGS

FIG. 3A illustrates a timing diagram corresponding to an LSB program operation according to a first programming method;

FIG. 3B illustrates a timing diagram corresponding to an MSB program operation according to the first programming method;

FIG. 3C illustrates a timing diagram corresponding to a program operation according to a second programming method;

FIG. 4A illustrates the possible shifts of threshold voltage experienced by a generic memory cell during an LSB program operation and an MSB program operation according to the first programming method;

FIG. 4B illustrates the possible shifts of threshold voltage experienced by a generic memory cell during a program operation according to the second programming method;

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
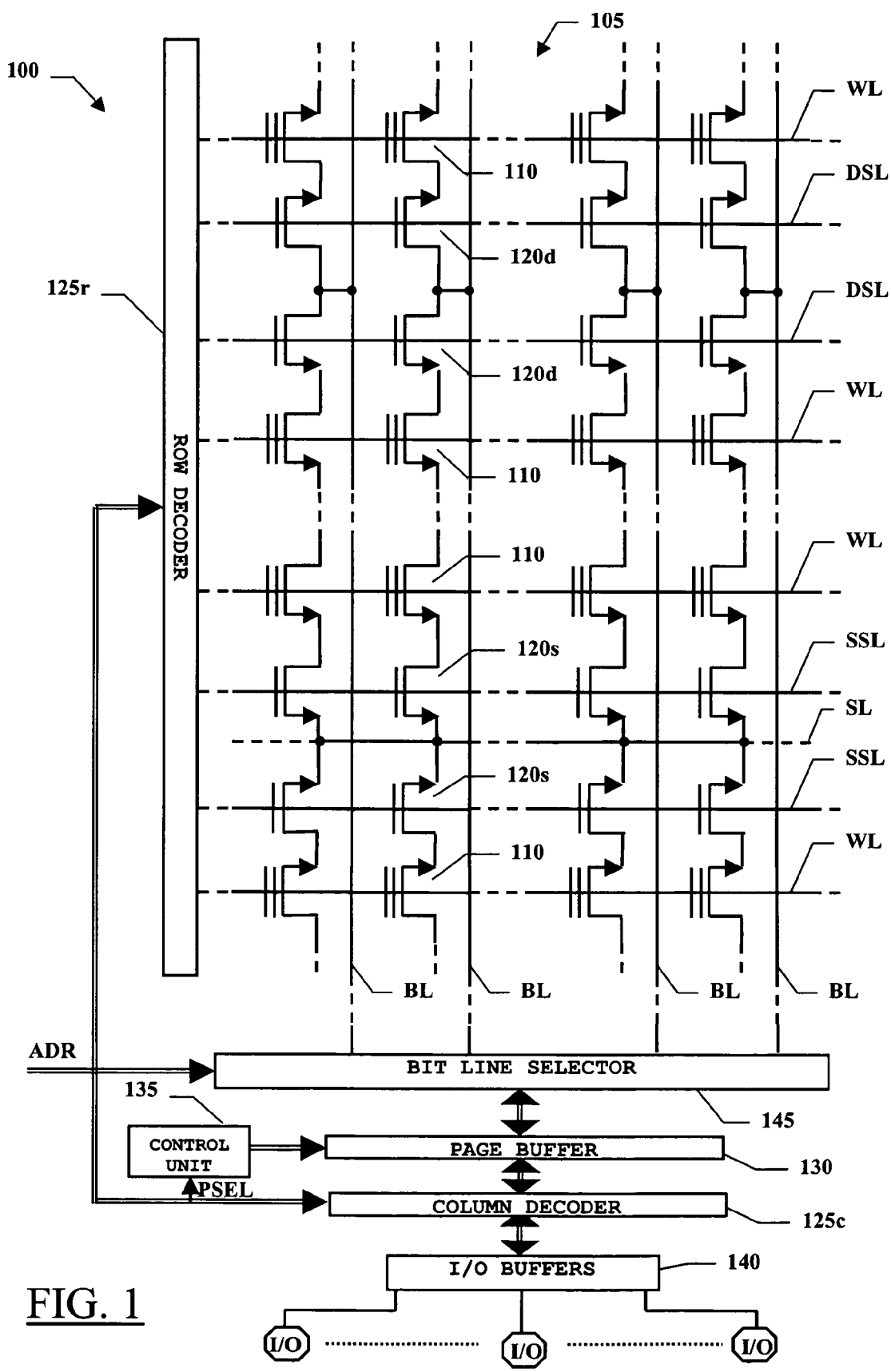
FIG. 1 is a circuital view of a non-volatile memory device, particularly of the NAND type including a page buffer according to an embodiment of the present invention.

With reference to the drawings, in FIG. 1 a non-volatile semiconductor memory, globally identified as 100, is illustrated, particularly an electrically-programmable, non-volatile semiconductor memory, for example a flash memory.

The flash memory 100 is integrated in a chip of semiconductor material (not shown), and includes a matrix 105 of memory cells 110 adapted to store data, arranged in a plurality of rows and a plurality of columns.

Typically, each memory cell 110 consists of an N-channel MOS transistor having a charge-storage element, such as a conductive floating gate adapted to be charged by electrons.

The flash memory 100 is a multi-level memory, particularly (for the sake of simplicity) a four-level memory, each cell being adapted to store a two-bit binary value, comprised of a Least Significant Bit (LSB) and a Most Significant Bit (MSB). Without entering into excessive details, well known to those skilled in the art, in an erased condition (first state, associated by convention with a logic value "11"), the memory cell 110 has a low threshold voltage value. The memory cell 110 may be programmed into any one of three further different states by causing amounts of electric charge to be put into the floating gate thereof. Each of these further three states is characterized by an increased threshold voltage value (given by an increased amount of floating-gate electric charge) compared to that of the preceding state. More particularly, a second state (associated with a logic value "10"), is characterized by a threshold voltage value that is higher than that of the first state, and that is in turn lower than that of a third state (associated with a logic value "00"). Finally, a fourth state (associated with a logic value "01"), is characterized by having the highest threshold voltage value. As will be made clearer in the following, when a selected memory cell 110 is selected for reading its content, the memory cell 110 will be conductive or not depending on its threshold voltage value and on the voltage value that is applied thereto during the reading.

The flash memory 100 has a so-called NAND architecture: in the matrix 105, groups of, e.g., eight, sixteen or even more (e.g., thirty-two) memory cells 110 are connected in series to each other to form a respective memory cells string, and different memory cells strings belonging to a same matrix column are connected in parallel to each other to a same bit line BL.

The memory cells 110 of a generic string are in particular connected in series between a source select N-channel MOS transistor 120s and a drain select N-channel MOS transistor 120d. A generic, intermediate memory cell 110 in the memory cells string has the drain terminal connected to the source terminal of an adjacent memory cell 110, and the source terminal connected to the drain terminal of another adjacent memory cell 110. One of the two end memory cells 110 located at the ends of the string has the drain terminal connected to the source terminal of the drain select transistor 120d; the drain terminal of the drain select transistor 120d is connected to the corresponding bit line BL, as well as to the drain terminal of the corresponding drain select transistor 120d of an adjacent memory cells string. Likewise, the other end memory cell 110 of the string has the source terminal connected to the drain terminal of the source select transistor 120s; the source terminal of the source select transistor 120s is connected to the source terminal of the corresponding source select transistor 120s of another adjacent memory cells string.

The control gate terminals of the memory cells 110 in each row are connected to a corresponding word line WL. The gate terminals of the drain select transistors 120d belonging to a common row of the matrix 105 are all connected to a corresponding drain select line DSL; similarly, the gate terminals of the source select transistors 120s belonging to a common row are all connected to a corresponding source select line SSL. The drain terminals of the drain select transistors 120d belonging to a common column of the matrix 105 are connected to a corresponding bit line BL. Conversely, the source terminals of all the source select transistors 120s in the matrix 105 are connected to a common source line SL (which is typically kept at a reference voltage, or ground).

The memory cells 110 belonging to the same row and thus coupled to the same word line WL are logically partitioned into different sets. Assuming, merely by way of example, that the matrix 105 includes 8192 bit lines BL, two sets of 4096 memory cells each for each word line WL are defined, a first set consisting for example of the memory cells 110 in an even position, and a second set consists of the memory cells 110 in an odd position.

As previously stated, the two bits stored in each memory cell 110 comprise an LSB and an MSB. Moreover, it subsists a correspondence between the logic values assumed by the LSB and MSB, and the threshold voltage values of the memory cells 110. For reducing the number of read accesses necessary to retrieve the stored data, the correspondence between logic values and threshold voltages makes use of the Gray coding.

Figure 2A:
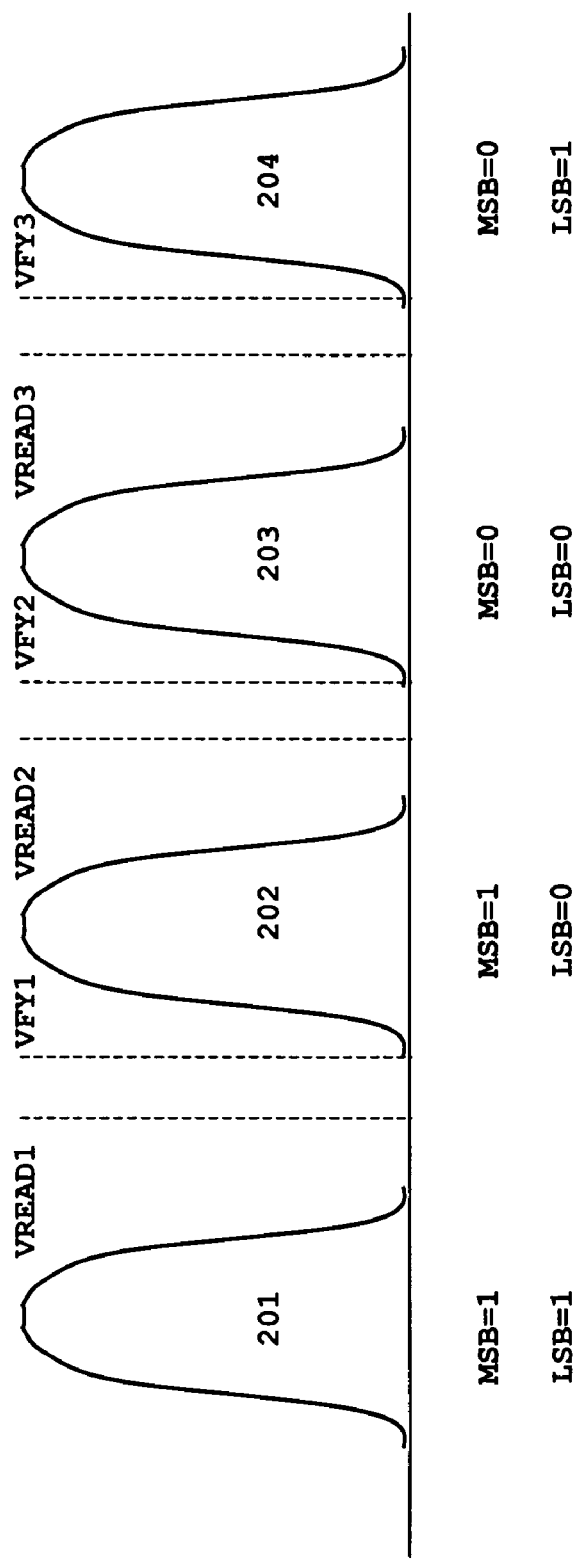
FIG. 2A is a simplified view of the statistical distributions threshold voltages of the memory cells of the memory device of FIG. 1.

More particularly, referring to FIG. 2A, a simplified view of threshold voltages statistical distributions 201, 202, 203, 204 of the memory cells 110 is illustrated. More particularly, the distribution 201 represents the distribution of the threshold voltage values of the memory cells in the erased condition, i.e., of the cells belonging to the first state, associated with the logic value "11" (MSB=1, LSB=1). The distribution 202 represent the distribution of the threshold voltage values of the memory cells in the second state, associated with the logic value "10" (MSB=1, LSB=0); the distribution 203 represent the distribution of the threshold voltage values of the memory cells in the third state, associated with the logic value "00" (MSB=0, LSB=0); and the distribution 204 represent the distribution of the threshold voltage values of the memory cells in the fourth state, associated with the logic value "01" (MSB=0, LSB=1). The distributions are for example roughly Gaussian in shape, and are each one centered around a center threshold voltage value. Thanks to the Gray coding, states that are adjacent (in terms of their distribution of threshold voltage values) have corresponding logic values that differ from each other for only one bit.

Each word line WL corresponds, according to the present example, to four memory pages, each one corresponding to a specific group of bits. More particularly, a first LSB page includes the LSB stored in the memory cells 110 in even positions (belonging to the first set of memory cells), while a first MSB page includes the MSB stored in the memory cells in even positions. Furthermore, a second LSB page includes the LSB stored in the memory cells in odd positions (belonging to the second set of memory cells), while a second MSB page includes the MSB stored in the memory cells in odd positions. Consequently, the data stored into a single memory cell belongs both to an LSB page and to an MSB page.

Given that each memory cell 110 is capable of storing 2 bits, each set of 4096 memory cells stores 1024 bytes. Consequently, each memory page is capable of storing 512 bytes. Thus, if, still by way of example, the matrix 105 includes 2048 word lines WL, the memory 100 has a total of 8192 memory pages of 512 bytes each. It is pointed out that the number of bit lines and word lines as well as the size of the memory page, may greatly vary, not being a limitation for the present invention. In particular, the number of memory pages that are associated with a generic word line may be higher, particularly multiples of two, such as eight and so on.

The flash memory 100 receives an address code ADR for selecting a desired memory page. A portion of the address code ADR is supplied to a row decoder 125r, which selects the desired word line WL, as well as the corresponding drain select line DSL and the corresponding source select line SSL. Another portion of the address code ADR is supplied to a column decoder 125c; the column decoder 125c connects I/O buffers 140, which are in turn associated with I/O terminals I/O of the flash memory 100, to a page buffer 130. A further portion of the address code ADR, denoted PSEL in FIG. 1, for example one bit, is used for selecting which one of the (two, in the example) memory pages (the memory page including the MSBs or the memory page including the LSBs of the memory cells of a given set) is addressed.

As will be described in greater detail in the following, the page buffer 130 is exploited as a temporary storage during read/program operations on the memory cells 110 of the selected page. The page buffer 130 has a storage capability at least equal to the storage capability of a memory page. For fitting an internal data parallelism of the flash memory 100 with a maximum external data parallelism, depending on a number p of the I/O terminals I/O (for example, eight or sixteen), the column decoder 125c provides to the page buffer 130 a data word to be written, or provides to the I/O terminals I/O a data word read, in chunks of p data bits at a time. Particularly, according to the decoding of the received portion of the address code ADR, the column decoder 125c connects desired portions of the page buffer 130 to the I/O terminals I/O.

The operation of the flash memory 100 is generally managed by a control unit, schematized as a block identified as 135, for example a microcontroller or a finite-state machine.

A memory page is selected by selecting a given word line WL, and a packet of bit lines BL; for example, if four memory pages of 512 Bytes each exist for each word line WL, one page corresponding to the LSB of the memory cells in even position, one corresponding to the MSB of the memory cells in even position, one corresponding to the LSB of the memory cells in odd position, and one corresponding to the MSB of the memory cells in odd position, the packet of selected bit lines BL includes the 4096 bit lines in even position or the 4096 bit lines in odd position (it has to be remembered that the data stored into a single memory cell belongs both to an LSB page and to an MSB page). The selection of the word line WL is directly performed by the row decoder 125r, while the selection of the packet of bit lines BL is performed by a bit line selector 145 between the matrix 105 and the page buffer 130. According to the decoding of a respective portion of the address code ADR, the bit line selector 145 selects the desired packet of bit lines and connects them to the page buffer 130.

During a read operation (page read), a data word stored in the selected memory page is read out and latched into the page buffer 130. The data word, temporarily stored in the page buffer 130, is then serially outputted through the I/O terminals I/O in chunks of, e.g., eight or sixteen bits by means of the column decoder 125c.

In greater detail, in order to access a given memory cell 110 for reading the content thereof, the drain select transistor 120d and the source select transistor 120s in the memory cells string to which the cell belongs are turned on, by asserting the drain select line DSL and the source select line SSL (for example, these two lines are brought to a voltage equal to a supply voltage Vdd of the memory). The bit line BL to which there is connected the string of cells containing the memory cell to be read is selected by the bit line selector 145. The row decoder 125r biases the word line WL to which the selected memory cell belongs to a specific reading voltage VREADX (X=1,2,3, as is explained in the following) adapted to discriminate the programming state of the memory cell. The remaining word lines WL controlling the gates of the other memory cells of the same string are all brought to a potential sufficiently high to ensure that these memory cells are turned on irrespective of their programming state (for example, a voltage of approximately 4.5 V). All the other word lines WL (associated with different memory cells strings) are for example kept grounded.

For reading the MSB of a memory cell 110, the row decoder 125r biases the word line WL to which the selected memory cell belongs to a reading voltage VREAD2, having a value that is intermediate between the center threshold voltages of the distribution 202 and the voltages of the distribution 203. If the threshold voltage of the selected memory cell 110 is lower than the reading voltage VREAD2, the selected memory cell 110 conducts, thus indicating that the MSB is equal to 1 (it has to be noted that it does not matter if the selected cell belongs to the distribution 201 or to the distribution 202, because both of which correspond to data values in which the MSB is equal to one). Conversely, if the threshold voltage of the selected memory cell 110 is higher than the reading voltage VREAD2, the selected memory cell 110 does not conduct, thus indicating that the MSB in the stored pair of bit is equal to 0. Thus, it can be appreciated that only one reading operation is necessary to retrieve the value of the MSB.

For reading the LSB two reading operations are necessary. More specifically, a first reading operation is performed by biasing, by means of the row decoder 125r, the word line WL to which the selected memory cell belongs to a reading voltage VREAD1, having a value that is intermediate between the center threshold voltages of the distributions 201 and 202. If the threshold voltage of the selected memory cell 110 is lower than the reading voltage VREAD1, the selected memory cell 110 conducts, thus indicating that it belongs to the distribution 201 (first programming state), and that the LSB is equal to 1. In this case, just one read access is necessary for retrieving the stored LSB. Conversely, if the threshold voltage of the selected memory cell 110 is higher than the reading voltage VREAD1, the selected memory cell 110 does not conduct, thus indicating that it does not belong to the distribution 201. In the latter case, a second reading operation needs to be performed, biasing the word line WL to which the selected memory cell belongs to a reading voltage VREAD3, having a value that is intermediate between the center threshold voltages of the distributions 203 and 204. If the threshold voltage of the selected memory cell 110 is lower than the reading voltage VREAD3, the selected memory cell 110 conducts, thus indicating that the LSB is equal to 0 (given that the first reading operation has indicated that the threshold voltage is higher than VREAD1). Conversely, if the threshold voltage of the selected memory cell 110 is higher than the reading voltage VREAD3, the selected memory cell 110 does not conduct, thus indicating that it belongs to the distribution 204, and that the LSB is equal to 1.

During a program operation (page program), a data word to be written, received from outside the memory through the I/O terminals I/O, is loaded into the page buffer 130. The data word to be written is received serially in, e.g., eight- or sixteen-bits chunks, and the page buffer 130 is thus replenished with data in a sequence of steps; when the buffer has eventually been filled, the data are written in parallel into the memory cells of a given selected page.

Memory cells 110 are programmed by Fowler-Nordheim tunneling of electrons into the floating gate. In order to access a given memory cell 110 for programming it, the drain select transistor 120d in the memory cells string to which the cell belongs is turned on by asserting the drain select line DSL (for example, bringing this line to the supply voltage Vdd), whereas the source select transistor 120s is kept off by keeping the source select line SSL deasserted (e.g., grounded); the bit line BL to which there is connected the string of cells containing the memory cell to be programmed is selected by the bit line selector 145. The row decoder 125r biases the word line WL to which the selected memory cell belongs to a programming voltage VPROG, whose value and evolution in time is a function of the programming state that the memory cell 110 has to assume at the end of the program operation. As previously disclosed, the fact that a memory cell 110 is in a particular state is determined by its threshold voltage value, that is in turn determined by the amount of charge present in the corresponding floating gate. Moreover, the amount of charge is in some way proportional to the value and to the rate of increase of the programming voltage VPROG that is applied to the memory cell 110 (e.g., the higher the target threshold voltage value, the higher is the value of the programming voltage VPROG to be applied). The remaining word lines WL controlling the gates of the other memory cells of the same string are all brought to a potential relatively high (e.g., approximately 10 V), for reasons that will be described later, but sufficiently lower than the programming voltage not to cause spurious programming. All the other word lines WL (associated with different memory cells strings) are for example kept grounded.

In order to program the selected memory cell, the bit line BL is kept grounded, so that the drain select transistor 120d is surely kept on. The ground voltage at the bit line, propagating through the drain select transistor and the channel of the memory cells in the string, reaches the channel of the memory cell to be programmed; here, the voltage difference between the control gate (at the programming voltage VPROG) and the channel (close to the ground voltage) experienced by the selected memory cell is sufficient to cause electron tunneling into the floating gate. On the contrary, if the bit line is biased at a higher potential, for example equal to the memory supply voltage (Vdd, e.g. 3 V), as the drain select line DSL, the drain select transistor 120d turns off. Meanwhile, the voltage of the memory cells string rises. The channels of the memory cells of the selected memory cells string thus remain floating, and, thanks to the relatively high voltage (10 V) applied to the word lines WL to which the selected memory cell does not belong, the string channel voltage rises due to the capacitive coupling to a value such that the control gate-to-channel voltage difference at the selected memory cell is not sufficient to cause significant electron tunneling, and the memory cell is not programmed. In this way , by applying to the selected bit lines the proper voltage, the cells 110 of the selected page to be brought to the desired logic value are then programmed, while the other cells 110 are left unchanged.

It should noted that, in a practical implementation, the previously described program operations are more complex. In fact, a possible program operation includes the repetition of a plurality of steps, at each step increasing the programming voltage VPROGR (up to a maximum value, e.g. 20V), and, after the application of the programming voltage, the execution of a verify phase for determining if the desired threshold voltage value has been reached. These features will be explained in greater detail referring to the following description of the page buffer embodiments herein disclosed.

The erase operation has the purpose of bringing a block of memory cells 110 back to the erased state (logic value "11"), wherein by memory cells block there is intended a group of memory cells 110 corresponding to all the word lines WL of a string.

In order to erase a given block of memory cells 110, the semiconductor well including all the cells of the matrix 105 is biased to a relatively high erase voltage VERASE (e.g., 20 Volts) by means of an erase control circuit, not shown in the figures, and all the bit lines BL of the matrix 105 are kept floating. Moreover, the row decoder 125r biases the word lines WL corresponding to the block to the ground voltage, while the remaining word lines WL of the matrix 105 are kept floating. The drain select lines DSL and the source select lines SSL of the block are kept floating (but they are precharged at about the supply voltage Vdd before the well is biased to the erase voltage VERASE), while the remaining are grounded. In this way, each memory cell 110 included in the selected block is biased in such a way to trigger the removal (by means of tunneling effect) of the electrical charge possibly stored in its floating gate. As previously noted referring to the case of the program operation, even the erase operation is in practice more complex, including erase verify phases and soft program operations. Again, these additional features will be explained in greater detail referring to the following description of the page buffer embodiment disclosed herein.

Figure 2B:
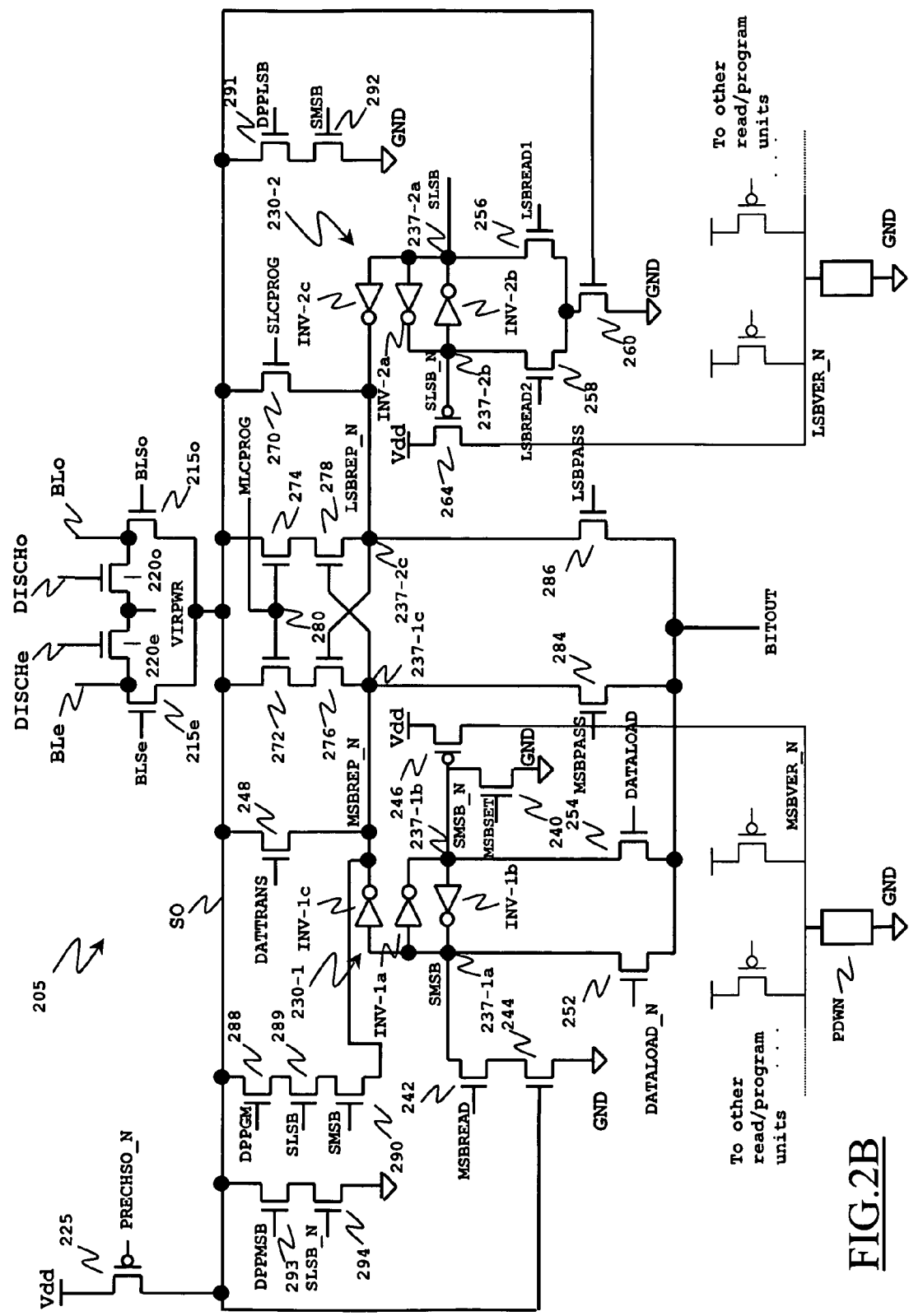
FIG. 2B illustrates a circuital view of a read/program unit included in the page buffer of the memory device of FIG. 1, according to a first embodiment of the present invention.

In FIG. 2B the circuit structure of a part of the page buffer 130 is shown, according to a first embodiment of the present invention.

It has to be underlined that, unless differently specified, the signals described in connection with the FIG. 2B are to be intended as logic signals, i.e., adapted to assume two voltage values, that is the supply voltage Vdd, and the ground voltage.

The page buffer includes a read/program unit 205 for each pair of adjacent bit lines. Particularly, an even bit line BLe and an odd bit line BLo are electrically couplable to a common node SO through respective N-channel MOS transistors 215e and 215o, included in the bit line selector 145. The transistors 215e and 215o have the respective drain terminal connected to the corresponding bit lines BLe, BLo, and the source terminals connected to the node SO; the gate terminals of the transistors 215e and 215o are controlled by respective select signals BLSe and BLSo, respectively. Two N-channel MOS transistors 220e and 220o are also provided in the bit line selector 145, each one for precharging/discharging the respective bit line BLe and BLo to a biasing voltage VIRPWR (such a precharge/discharge operation is preferably performed before any program operation, as described in the following). To this purpose, the transistors 220e and 220o have the source terminals connected to the corresponding bit lines BLe, BLo; the drain terminals of the transistors 220e and 220o are connected together to a terminal for providing the biasing voltage VIRPWR. The gate terminals of the transistors 220e, 220o are controlled by respective precharge/discharge signals DISCHe, DISCHO.

A P-channel MOS transistor 225 is used for precharging the node SO during certain phases of the page buffer functioning, e.g., at the beginning of a read/program operation. For this purpose, the transistor 225 has the drain terminal connected to the node SO, the source terminal connected to a terminal providing the supply voltage Vdd, and the gate terminal controlled by a pre-charge signal PRECHSO_N.

The read/program unit 205 includes a first latch 230-1 and a second latch 230-2. The latch 230-1 is adapted to be employed for the reading of the MSB, for the programming of the MSB, for the loading of data from the outside of the page buffer during a writing operation, for the cache read and for the cache program operations. The latch 230-2 is instead adapted to be employed for the reading of the LSB, for the programming of the LSB and the MSB, for the cache read and for the erase operations.

The latch 230-1 is formed by two inverters INV-1a and INV-1b, connected in a loop with the input terminal of the inverter INV-1a connected to the output terminal of the inverter INV-1b so as to define a node 237-1a, providing a signal SMSB, and the output terminal of the inverter INV-1a connected to the input terminal of the inverter INV-1b so as to define a node 237-1b, providing a signal SMSB_N that is the logic complement of the signal SMSB. Moreover, a further inverter INV-1c has an input terminal connected to the node 237-1a, and an output terminal that is connected to a node 237-1c, providing it the signal MSBREP_N, having the same polarity of the signal SMSB_N.

An N-channel MOS transistor 240 is used to set the latch 230-1; by "set the latch" there is meant bringing the signal SMSB to the supply voltage VDD. For this purpose, the transistor 240 has the drain terminal connected to the node 237-1b, the source terminal connected to ground and the gate terminal controlled by an MSB latch reset signal MSBSET. The latch 230-1 is reset (i.e., the signal SMSB is brought to the ground voltage) by means of two N-channel MOS transistors 242 and 244 that are connected in series. The transistor 242 has the drain terminal connected to the node 237-1a and the source terminal connected to the drain terminal of the transistor 244. The source terminal of the transistor 244 is connected to ground. The gate terminal of the transistor 244 is controlled by the voltage at the node SO, whereas the gate terminal of the transistor 242 is controlled by a MSB latching or read signal MSBREAD.

A P-channel MOS transistor 246 is used during a program verify phase for establishing if a MSB program operation has been accomplished in the correct way. For this purpose, the transistor 246 has the source terminal connected to a terminal providing the supply voltage Vdd, a gate terminal connected to the node 237-1b, and the drain terminal connected (node MSBVER_N) to a first terminal of a highly-resistive pull down circuit PDWN, the latter having a second terminal connected to ground. The pull down circuit PDWN is placed outside the single read/program unit 205, and its first terminal is commonly connected to transistors 246 in all the other read/write units included in the page buffer 130, in the same way as for the read/write unit herein described.

An N-channel MOS transistor 248 is used to couple the node 237-1c to the node SO, in order to allow the data transfer from the latch 230-1 to the latch 230-2. For this purpose, the transistor 248 has the drain terminal connected to the node SO and the source terminal connected to the node 237-1c. The gate terminal of the transistor 248 is controlled by a data transfer signal DATTRANS.

N-channel MOS transistors 252 and 254 are used to load data to be written into the first latch 230-1 at the beginning of a program operation. For this purpose, the transistors 252 and 254 have respective drain terminals connected to the nodes 237-1a and 237-1b. The source terminals of the transistors 252 and 254 are connected together to an I/O data line BITOUT in turn connected to the column decoder 125c. The gate terminal of the transistor 252 receives a data load signal DATALOAD_N (whose logic state determines the target value to be loaded into the first latch 230-1) and the gate terminal of the transistor 254 receives a further data load signal DATALOAD (which is the logic complement of the data load signal DATALOAD_N).

The latch 230-2 is formed by two inverters INV-2a and INV-2b, connected in a loop with the input terminal of the inverter INV-2a connected to the output terminal of the inverter INV-2b so as to define a node 237-2a, providing a signal SLSB, and the output terminal of the inverter INV-2a connected to the input terminal of the inverter INV-2b so as to define a node 237-2b, providing a signal SLSB_N that is the logic complement of the signal SLSB. Moreover, a further inverter INV-2c has an input terminal connected to the node 237-2a, and an output terminal that is connected to a node 237-2c, providing it the signal LSBREP_N, having the same polarity of the signal SLSB_N.

Three N-channel MOS transistors 256, 258 and 260 are used to set/reset the latch 230-2 and to read/verify the LSB. For this purposes, the transistor 256 has the drain terminal connected to the node 237-2a, the source terminal connected to the drain terminal of the transistor 260, and the gate terminal controlled by a first LSB latching or read signal LSBREAD1. The transistor 258 has the drain terminal connected to the node 237-2b, the source terminal connected to the drain terminal of the transistor 260, and the gate terminal controlled by a second LSB latching or read signal LSBREAD2. Moreover, the transistor 260 has the source terminal connected to a terminal providing the ground voltage, and the gate terminal connected to the node SO.

A P-channel MOS transistor 264 is used during verify phases for establishing if an erase operation, or an LSB or an MSB program operation has been accomplished in the correct way. For this purpose, the transistor 264 has the source terminal connected to a terminal providing the supply voltage Vdd, a gate terminal connected to the node 237-2b, and the drain terminal connected (node LSBVER_N) to a first terminal of a further highly-resistive pull down circuit (not shown in the figure for the sake of simplicity), having the same features of the highly-resistive pull down circuit PDWN, and connected to all the read/write units included in the page buffer 130.

A further N-channel MOS transistor 270 is used to couple the node 237-2c to the node SO, thus to the selected bit line BLe or BLo, during a program operation (as described in greater detail in the following). For this purpose, the transistor 270 has the drain terminal connected to the node SO and the source terminal connected to the node 237-2c; the gate terminal of the transistor 270 is controlled by a program signal SLCPROG.

The read/program unit 205 further includes a four transistors structure that is used for programming the MSB. More particularly, the structure includes four N-channel MOS transistors 272, 274, 276 and 278. The transistor 272 has the drain terminal connected to the node SO, the source terminal connected to the drain terminal of the transistor 276, and the gate terminal connected to the gate terminal of the transistor 274 (node 280). The transistor 274 has the drain terminal connected to the node SO, the source terminal connected to the drain terminal of the transistor 278, and the gate terminal that is connected to the node 280. The transistor 276 has the source terminal connected to the node 237-1c, and the gate terminal connected to the node 237-2c. The transistor 278 has the source terminal connected to the node 237-2c, and the gate terminal connected to the node 237-1c. Moreover, the node 280 receives a further program signal MLCPROG.

Two N-channel MOS transistors 284, 286 are used for providing data to the output of the page buffer 130. More particularly, the transistor 284 has the drain terminal connected to the node 237-1c, the source terminal connected to the I/O data line BITOUT, and the gate terminal controlled by a MSB output signal MSBPASS. The transistor 286 has the drain terminal connected to the node 237-2c, the source terminal connected to the I/O data line BITOUT, and the gate terminal controlled by a LSB output signal LSBPASS.

In the following, some of the possible operations executed by the page buffer 130 will be described (i.e., for executing read, program and verify operations). For the sake of brevity, reference will be made only to the cases in which the selected memory cells 110 that are to be read, programmed and erased are connected to the even bit lines BLe (i.e., corresponding to an even page), being the case that for odd bitlines BLo operation is exactly the same. More specifically, the following description will refer in particular to a single read/program unit 205. Consequently, although reference will be made also to whole memory pages, the description will deal in great detail only with a single memory cell 110 thereof, and with its corresponding string.

LSB Read Operation

As previously stated, thanks to the adoption of the Gray coding and thanks to the fact that the data stored into each single memory cell belongs to two memory pages (both to an LSB page and to an MSB page), an LSB read operation requires executing at most two reads, one exploiting the reading voltage VREAD1, and one exploiting the reading voltage VREAD3. Firstly, the latch 230-2 is set. To this purpose, the node SO is driven to the supply voltage Vdd by means of the transistor 225, that is activated by driving the signal PRECHSO_N to the ground voltage. At the same time, the signal LSBREAD2 is driven to the supply voltage Vdd. In this way, the transistors 258 and 260 turn on, forcing the node 237-2b to the ground voltage. Thus, the signal SLSB_N assumes the ground voltage value, and the signal SLSB is driven by the latch 230-2 to the supply voltage Vdd.

The next step consists of precharging the selected (even) bit lines BLe at a predetermined voltage value. For this purpose, the transistor 225 remains kept on, while the select signal BLSe (that is provided to the gate terminal of the transistor 215e) is driven to a predetermined voltage V1.

Consequently, the (parasitic capacitance associated with) bit line BLe charges and reaches a voltage equal to V1 minus threshold voltage VTHN of the transistor 215e, while the node SO remains at the supply voltage. In the meantime, the word line WL corresponding to the selected page of memory cells 110 is driven by the row decoder 125r to the reading voltage VREAD1, the remaining word lines WL controlling the gates of the other memory cells of the selected string are all brought to a potential sufficiently high (e.g., 5.5 V) to ensure that these memory cells are turned on irrespective of their programming state, and the selected drain select line DSL is driven to the supply voltage Vdd. At this time, the transistor 225 turns off (the signal PRECHSO_N is driven back to the supply voltage Vdd), the select signal BSLe is driven to the ground voltage, and the source select line SSL corresponding to the selected string is driven to the ground voltage too.

In this way, the selected string is capable to conduct or not depending on the state of the selected memory cell 110. Given that the selected bit line BLe was charged to (and then left floating at) a voltage equal to V1–VTHN, the bit line begins to discharge if the threshold voltage of the selected memory cell is lower than the reading voltage VREAD1 (i.e., the selected memory cell 110 is conductive), otherwise the bit line remains at the voltage V1–VTHN. Meanwhile, the node SO remains charged at the supply voltage Vdd. Subsequently, the select signal BLSe is driven to a further predetermined voltage V2, whose value is lower than that of the predetermined voltage V1. If the voltage of the selected bit line BLe has reached a value that is lower than V2–VTHN, the transistor 215e turns on, thus forcing the voltage of the node SO to assume a voltage value equal to that of the selected bit line BLe (i.e., close to the ground voltage), otherwise the transistor 215e remains turned off, and the node SO remains at a voltage equal to the supply voltage Vdd. At this moment, the signal LSBREAD1 is driven to the supply voltage Vdd. If the node SO is still at the supply voltage Vdd (turning on the transistor 260), the node 237-2a is brought to the ground voltage through the transistors 256 and 260 (SLSB driven to ground voltage).

In this way, the latch 230-2 switches, and thus the signal SLSB_N is driven to the supply voltage Vdd. This means that the LSB in the selected cell is equal to 0. Contrarily, if the node SO has been discharged, the transistors 256, 260 and the latch 230-2 are properly sized in such a way that the latch 230-2 does not switch (SLSB_N=0, SLSB=Vdd). This implies that the LSB in the selected cell is equal to 1. In fact this latter case takes place if the threshold voltage of the selected memory cell 110 belongs to the distribution 201, and thus the selected string is capable to drain current and to thereby discharge the node SO.

The second read phase (the one exploiting the reading voltage VREAD3) proceeds in a way similar to the one previously described. The only differences consist in the fact that this time the word line WL corresponding to the selected page of memory cells 110 is driven by the row decoder 125r to the reading voltage VREAD3, and it is the transistor 258, driven by the signal LSBREAD2, rather than the transistor 256, that is used for causing the latch 230-2 to switch. In this way, if the node SO remains at the supply voltage Vdd (which occurs only when the selected memory cell 110 has the threshold voltage belonging to the distribution 204, and thus does not drain current), the signal SLSB_N at the node 237-2b is brought to the ground voltage. This implies that the LSB in the selected cell is equal to 1. If instead the node SO is discharged, the LSB value is the same as the one given by the previous read (that is, the one exploiting the reading voltage VREAD1): more specifically, LSB=1 if the threshold voltage of the selected memory cell belongs to the distribution 201, and LSB=0 if the threshold voltage belongs to the distribution 202 or 203.

After these two reads, the correct LSB value is stored in the latch 230-2. More particularly, if the signal SLSB is equal to the supply voltage Vdd (SLSB_N equal to the ground voltage), it means that the LSB is equal to 1, and if the signal SLSB is equal to the ground voltage (SLSB_N equal to the supply voltage Vdd), it means that LSB is equal to 0.

The retrieved LSB value can be provided to the outside of the page buffer 130 (i.e., to the column decoder 125c and to the I/O buffers 140) using the value of the signal LSBREP_N, equal to the value of the signal SLSB_N. The value of the signal LSBREP_N is in turn provided to the I/O data line BITOUT activating the transistor 286 by asserting to the supply voltage Vdd the signal LSBPASS.

Given that the number of bits read in parallel in a page is of the order of 16K (i.e., the page buffer 130 includes 16K read/program units 205 that perform the reading operations in a parallel way), and given that the read bits are provided to the I/O terminals of the I/O buffers 140 in group of 8/16parallel bits according to synchronous steps during about 50 nsec each one, the whole output phase takes a time of the order of hundred of microseconds. During this phase, it is possible to use the latch 230-1 for performing an MSB reading, thus executing the so-called cache read. In fact, all the LSB bits previously read are stored in the latch 230-2 of the corresponding read/program unit 205 as in a sort of temporary memory register, that is not used during the MSB read operation.

It has to be noted that, for performing the LSB read operation previously cited, one or at most two reading accesses are necessary. This is possible thanks to the choice of using the Gray coding for associating the logic values to the corresponding states, and thanks to the fact that the data stored into each single memory cell belongs to two memory pages.

MSB Read Operation

Referring now to an MSB read operation, a first step consists in opportunely setting the latch 230-1. For this purpose the signal MSBSET is driven to the supply voltage Vdd, thus activating the transistor 240. In this way, the signal SMSB_N at the node 237-1b is driven to the ground voltage. Consequently, the signal SMSB at the node 237-1a is driven by the latch 230-2 to the supply voltage Vdd. The MSB read operation is similar to the LSB read operation. Briefly, the selected (even) bit line BLe is charged to the voltage V1-VTHN, in the same way as in the LSB case.

Subsequently, the signal MSBREAD is asserted to the supply voltage, while the select signal BLSe is driven to the voltage V2. Moreover, the word line WL corresponding to the selected page of memory cells 110 is driven by the row decoder 125r to the reading voltage VREAD2, the remaining word lines WL controlling the gates of the other memory cells of the selected string are all brought to a potential sufficiently high to ensure that these memory cells are turned on irrespective of their programming state, and the selected drain select line DSL is driven to the supply voltage Vdd. In this way, if the threshold voltage of the selected memory cell 110 is higher than the reading voltage VREAD2, the node SO remains at the supply voltage Vdd, and the transistor 244 turns on. In this case, the node 237-1a discharges, and the corresponding signal SMSB is brought to the ground voltage, which means that MSB is equal to 0.

On the contrary, if the node SO discharges, the transistor 244 does not turn on, and the signal SMSB remains at the supply voltage Vdd, thus meaning that MSB is equal to 1. The MSB value can be provided to the outside of the page. buffer 130 (i.e., to the column decoder 125c and to the I/O buffers 140) using the value of the signal MSBREP_N, equal to the value of the signal SMSB_N (having a voltage value that is complementary to the one of the signal SMSB). The value of the signal MSBREP_N is in turn provided to the I/O data line BITOUT activating the transistor 284 asserting the signal MSBPASS to the supply voltage Vdd.

Also in this case, it is possible using the other latch (i.e., the latch 230-2) for performing an LSB read operation during the output of the content of the page buffer. In fact, all the MSB bits previously read are stored in the latch 230-1 of the corresponding read/program unit 205 as in a sort of memory register, that is not used during an LSB read operation. Consequently, also in this case it is possible to perform a cache read operation.

It has to be noted that the page buffer 130 is operated to execute an MSB read operation rather than an LSB read operation (or vice versa) depending on whether an MSB memory page rather then an LSB memory page has been addressed. This is controlled by the control unit 135 that decodes and recognizes the value of the address portion PSEL. In fact, the control unit 135 generates all the signals adapted to drive the execution of all the procedures necessary for performing an LSB read operation (e.g., applying the reading voltages VREAD1 and VREAD3) or for performing an MSB read operation (e.g., applying the reading voltage VREAD2), depending on the value of the address portion PSEL.

Program Operations (First Method)

A first, method for performing a program operation on both the LSB and the MSB requires two different operations. More specifically, assuming that each program operation is performed on erased memory cells 110 (i.e., in the first state), an LSB program operation is firstly performed. If the selected memory cell 110 has to be programmed in such a way to have an LSB value that is equal to 0, the threshold voltage of the selected memory cell has to be brought to a value within the distribution 202 (i.e., to the second state). Otherwise, the threshold voltage of the selected memory cell 110 remains in the first distribution (first state, or erased state). The MSB value may be programmed at a later time, by means of a different program operation. More specifically, if the selected memory cell 110, having an LSB value indifferently equal to 1 or 0, has to be programmed in such a way to have an MSB value that is equal to 1, it is not necessary to modify the memory cell threshold voltage. The threshold voltage of the memory cell remains at the value it reached either after the erase, or during the programming of the LSB (i.e., the threshold voltage of the memory cell with target MSB=1 remains within the distribution 201, if LSB is 1, or within the distribution 202 if LSB is 0). On the contrary, if the selected memory cell 110 has to be programmed in such a way to have an MSB value that is equal to 0, the threshold voltage of the selected memory cell needs to be brought into the distribution 204 (i.e., to the fourth state) if the LSB is equal to 1 (i.e., if the threshold voltage before the MSB programming belonged to the distribution 201), or, if the LSB is equal to 0 (i.e., if the threshold voltage before the MSB programming belonged to the distribution 202), the threshold voltage of the selected memory cell has to be brought to the distribution 203 (i.e., to the third state).

Hereinafter, the LSB program operations and the MSB program operations, according to the first method of conducting a program operation will be described in greater detail.

LSB Program Operation (First Method)

The memory cells 110 belonging to a same word line WL are programmed in parallel, and the programming pulses are commonly applied at the memory cell's gate terminals. The main task of the page buffer 130 during this phase is to determine whether a single memory cell 110 belonging to the selected word line WL has to be programmed or not. For this purpose, each read/program unit 205 properly biases the corresponding bit line, in such a way that if the latter is maintained at the ground voltage, the corresponding memory cell 110 is programmed, otherwise, if the bit line is maintained to the supply voltage Vdd (more generally, to a program inhibit voltage), the corresponding memory cell 110 is not programmed, even if it receives the programming pulse on its control gate. Assuming that the memory cells 110 have preliminary been erased, their threshold voltages belong to the distribution 201.

The first step for programming the LSB is to store in the read/program unit 205 the target LSB value that has to be programmed, using the latch 230-1 (data load procedure). For this purpose, the node 237-1a is firstly brought to the ground voltage (latch reset operation). This is accomplished by precharging the node SO to the supply voltage Vdd by means of the transistor 225 (activated by the signal PRECH-SO_N), and then asserting the signal MSBREAD to the supply voltage. In this way, both the transistors 242 and 244 turn on, and the signal SMSB at the node 237-1a assumes the ground voltage. It is observed that the reset operation considered per-se puts the latch in a condition such that the corresponding memory cell will not be programmed. This is necessary in the case in which the page buffer 130 performs a partial data load procedure, i.e., when only a part of read/program units 205 included therein receives the corresponding desired LSB value that has to be programmed (only a portion of a memory page is to be modified). In this way, the read/program units 205 that do not have to perform a data load procedure act in the same way as they would act should they receive during the data load procedure the information of not executing any program operation on the respective memory cells. Having reset the signal SMSB, the next step consists of setting the signal SLSB at the node 237-2a. For this purpose, the signal SLSB_N at the node 237-2b (the logic complement of the signal SLSB) is brought to the ground voltage. This is accomplished by asserting the signal LSBREAD2 to the supply voltage. In this way, both the transistors 258 and 260 turn on (the node SO is still at the supply voltage Vdd), and the signal SLSB_N at the node 237-28 assumes the ground voltage.

Subsequently, the data load procedure is executed. For this purpose, the I/O data line BITOUT is driven to the ground voltage, and the transistors 252 and 254 are activated in a mutually exclusive way by means of the signals DATALOAD and DATALOAD_N in such a way to force to the ground voltage the signal SMSB or the signal SMSB_N, respectively. More particularly, if the LSB has to assume the 0 value, the program operation has to be enabled, forcing the signal SMSB_N to the ground voltage by asserting the signal DATALOAD to the supply voltage Vdd. On the contrary, if the LSB has to assume the 1 value, the program operation has to be inhibited, forcing the signal SMSB to the ground voltage by asserting the signal DATALOAD_N to the supply voltage Vdd.

The next step consists in transferring the data stored in the latch 230-1 into the latch 230-2; and this operation is referred to as data transfer. For this purpose, the node SO is precharged to the supply voltage, by means of the transistor 225. Then, the signal DATTRANS is asserted to the supply voltage Vdd. In this way, if the signal MSBREP_N at the node 237-1c (that has the same polarity as the signal SMSB_N) has a voltage equal to the ground voltage, the node SO discharges through the inverter INV-1c, otherwise, if the signal MSBREP_N has a voltage equal to the supply voltage, the node SO remains at the supply voltage too. Meanwhile, the transistor 256 is turned on by asserting the signal LSBREAD1 to the supply voltage Vdd. In this way, if the node SO has a voltage equal to the ground voltage, the signal SLSB remains at the supply voltage, otherwise, if the node SO has a voltage equal to the supply voltage Vdd, the signal SLSB is brought to the ground voltage. Thus, at the end of the data transfer operation, the signal SLSB has a voltage equal to that of the signal SMSB.

After this phase, the program operation is started. For this purpose, both the even bit line BLe and the odd bit line BLo are precharged to the supply voltage Vdd by asserting the signal VIRPWR to the supply voltage Vdd and by activating the transistors 220e and 220o by means of the signals DISCHe and DISCHo, respectively. These latter signals have voltage values that are higher than that of the supply voltage Vdd by at least a threshold voltage. Before applying to the selected word line WL the voltage VPROG (first programming pulse), the transistor 270 is turned on by asserting the signal SLCPROG to the supply voltage Vdd, and the select signal BLSe provided to the gate of the transistor 215e is driven to the supply voltage Vdd. If the signal LSBREP_N is at the ground voltage, the selected (even) bit line BLe discharges, otherwise, if the signal LSBREP_N is at the supply voltage Vdd, the selected bit line BLe remains at the supply voltage Vdd. By applying to the selected word line WL the programming voltage VPROG, the selected memory cell 110 will be programmed in the first case, otherwise, in the second case, the selected memory cell 110 will not be programmed.

As previously mentioned, the program operation includes the repetition of a plurality of steps, each step including the application to the selected word line of a programming voltage VPROGR pulse, whose value increases at each step (up to a maximum value), and then the execution of a verify phase for determining whether the desired threshold voltage value has been reached. Thus, the shift of the threshold voltage of the selected memory cell occurs by means of small increments thereof (e.g., of 250-300 mV per step). The specific number of the programming steps that are necessary to increment the threshold voltage of the selected memory cell until it reaches the desired distribution is not known a priori, because each memory cell responds to the same programming voltage VPROGR in a different way (because of the unavoidable mismatches among different cells given by the tolerances of the process parameters). Furthermore, memory cells belonging to the same word line WL typically need different numbers of programming steps for reaching the corresponding desired distributions (that can be different from cell to cell).

Consequently, after each of the programming steps a verify phase is needed. If the verify on a particular memory cell 110 gives an affirmative result, the read/program unit 205 corresponding thereto has to inhibit any further programming step on its corresponding memory cell, while the other memory cells corresponding to read/program units 205 in which the verify is not passed, are still subjected to further programming steps. The verify phase corresponding to each one of the threshold distributions 202, 203, 204 is a reading operation that makes use of reading voltages that are slightly higher than the corresponding reading voltage VREADX (X=1,2,3), to ensure a security margin. In the case of an LSB program verify read, a verify reading voltage VFY1 is used that has a value slightly higher than the value VREAD1. In this case, if the verify phase is passed (i.e., the threshold voltage of the selected memory cell 110 has reached the distribution 202), the read/write unit 205 has to force the voltage of the selected bitline to the supply voltage Vdd, in such a way to inhibit any further programming on the corresponding memory cell 110.

The verify starts with the precharging of the bit lines to a voltage equal to V1-VTHN (this is accomplished in the same way as in the previous operations), then proceeds with a read operation exploiting the verify reading voltage VFY1 on the selected word line WL, and activating the transistor 256 by asserting the signal LSBREAD1 to the supply voltage. It has to be noted that the verify phase is not preceded by any setting of the latch 230-2, differently from the case of normal read operation.

If the verify is passed (the memory cell threshold voltage has reached the distribution 202), the node SO will remain at the supply voltage Vdd. Thus, in the following programming step (that provides again for the precharging of the selected even bit line BLe SO to the supply voltage Vdd), the selected even bit line BLe will remain at the supply voltage Vdd and thus the corresponding memory cell 110 will not be programmed. On the contrary, if the verify is not passed (the memory cell threshold voltage has not reached the distribution 202), the signal SLSB_N will remain at the ground voltage, and in the following programming step, the selected even bit line BLe will be discharged again, and thus the selected memory cell 110 will be subjected to a further programming step.

The repetition of programming steps and verify phases ends when the nodes 237-2b (corresponding to the signals SLSB_N) of all the read/program units 205 of the page buffer 130 assume voltage values equal to the supply voltage Vdd. At this point, all the transistors 264 will be turned off, and the voltage value of the node LSBVER_N (that is common to all the read/program units 205 of the page buffer) will be brought to the ground voltage by means of the highly-resistive pull down circuit PDWN.

Referring to FIG. 3A, a timing diagram 310 showing an exemplary temporal evolution of the voltage applied to the selected word line WL during an LSB program operation (including the repetition of programming steps and verify steps) is illustrated. More particularly, in the example at issue, the exemplary temporal evolution of the voltage comprises eleven pulses of programming voltage VPROGR, indicated from now on as program voltage pulses 320(0)-320(10). The value of each program voltage pulse is higher then the value of the preceding pulse by an amount of, e.g., 250-300 mV. Each one of the program voltage pulses 320(0)-320(10) represents a pulse of programming voltage VPROGR. After each program voltage pulse, the voltage applied to the selected word line WL is dropped to the value necessary for performing a verify, i.e., in this case (LSB program operation), it assumes the value VFY1. The value of the first program voltage pulse 320(0) depends on technological process parameters, and may be determined in an empirical way. More particularly, the first program voltage pulse 320(0) should have a value adapted to avoid that memory cells 110 belonging to the distribution 201 and characterized by a fast response to the application of program voltage pulses (e.g., due to enhanced capacitive coupling to the corresponding word line WL) experience a threshold voltage shift such as to exceed the value VFY1.

In fact, should this occur, the threshold voltages of a number of memory cells 110 might be excessively incremented beyond the value VFY1. This will imply in turn an excessive widening of the distribution 202, that might overlap the distribution 203. The value of the first program voltage pulse 230(0) may be 16 V, while the maximum value reached by the programming voltage VPROG may be 19-20V.

Observing FIG. 3A, it can be shown that, in the example at issue, an LSB program operation may need (in the worst case) eleven program voltage pulses 320(0)-320(10) and eleven verifies.

MSB Program Operation (First Method)

The first step for programming the MSB consists of storing in the read/program unit 205 the desired MSB value that has to be programmed, using the latch 230-1 (data load procedure). For this purpose, the node 237-1a is firstly brought to the ground voltage (reset operation). This is accomplished by precharging the node SO to the supply voltage Vdd by means of the transistor 225 (activated by the signal PRECHSO_N), and then asserting the signal MSBREAD to the supply voltage. In this way, both the transistors 242 and 244 turn on, and the signal SMSB at the node 237-1a assumes the ground voltage.

Moreover, an LSB read operation is necessary, for getting knowledge of which distribution the threshold voltage of the selected memory cell has to be programmed into; preliminarily to reading the LSB, the latch 230-2 is reset; to this purpose, the node 237-2b is brought to the ground voltage by asserting the signal LSBREAD2 to the supply voltage Vdd. In this way, the signal SLSB_N assumes a voltage equal to the ground voltage, and consequently, the signal SLSB at the node 237-2a assumes a voltage equal to the supply voltage Vdd.

Subsequently, a data load procedure for loading into the latch 230-1 the information that indicates which MSB value is to be programmed is performed, in an identical way as for the LSB program operation. More particularly, if the signal SMSB_N is driven to the supply voltage Vdd, it means that the considered memory cell is not to be programmed (MSB=1); otherwise, if the signal SMSB_N is driven to the ground voltage, it means that an MSB program operation has to be performed (MSB=0).

The LSB read operation is then performed. This LSB operation is equal to the one previously cited, and is performed exploiting the reading voltage VREAD1.

It has to be noted that, as already mentioned in the foregoing, if an MSB=1 has to be programmed, the threshold voltage of the selected cell has to remain in the current distribution (i.e., in the distribution 201 if LSB=1 and in the distribution 202 if LSB=0). Vice versa, if an MSB=0 has to be programmed, a memory cell whose threshold voltage belongs to the distribution 201 has to be brought to the distribution 204, while a memory cell whose threshold voltage belongs to the distribution 202 has to be brought to the distribution 203.

As in the case of the LSB program operation, the next operation consists in transferring the data stored in the latch 230-1 to the latch 230-2. This is accomplished by asserting the signals DATTRANS and LSBREAD1, in the same way as in the LSB case. It has to be noted that if the signal SMSB_N is equal to the supply voltage, the signal SLSB_N will certainly assume the supply voltage Vdd. Contrarily, if the signal SMSB_N is equal to the ground voltage, the signal SLSB_N will maintain its previous voltage value.

The node SO is then precharged to the supply voltage Vdd, and the signal MLCPROG at the node 280 is asserted to the supply voltage Vdd too. In this way, the node SO is discharged to the ground voltage or not depending on the voltages of the nodes 237-1c (signal MSBREP_N, equal to the signal SMSB_N) and 237-2c (signal LSBREP_N, equal to the signal SLSB_N).

More particularly, if the signal MSBREP_N is at the supply voltage Vdd, and the signal LSBREP_N is at the supply voltage too, the transistors 272, 274, 276 and 278 are all activated, and the voltage of the node SO remains equal to the supply voltage Vdd.

If the signal MSBREP_N is at the ground voltage, and the signal LSBREP_N is at the supply voltage, the transistors 272, 274 and 276 are activated, while the transistor 278 is turned off. Consequently, the node SO is discharged to the ground voltage by means of the transistors 272 and 276.

If the signals MSBREP_N and LSBREP_N are both at the ground voltage, the transistors 272 and 274 are activated, while the transistors 276 and 278 are turned off. Consequently, the voltage of the node SO remains equal to the supply voltage Vdd.

Asserting now the signal MSBREAD to the supply voltage Vdd, the situation of the voltage values of the signals MSBREP_N (node 237-1c) and LSBREP_N (node 237-2c) will become one of the following:

case 1: if the LSB is such that the threshold voltage of the selected memory cell belongs to the distribution 201 (LSB=1), and if an MSB=1 has to be programmed, both the signals MSBREP_N and LSBREP_N will be at the supply voltage Vdd;

case 2: if the LSB is such that the threshold voltage of the selected memory cell belongs to the distribution 202 (LSB=0), and if an MSB=1 has to be programmed, both the signals MSBREP_N and LSBREP_N will be at the supply voltage Vdd;

case 3: if the LSB is such that the threshold voltage of the selected memory cell belongs to the distribution 201 (LSB=1), and if an MSB=0 has to be programmed, the signal MSBREP_N will be at the supply voltage Vdd, and the signal LSBREP_N will be at the ground voltage;

case 4: if the LSB is such that the threshold voltage of the selected memory cell belongs to the distribution 202 (LSB=0), and if an MSB=0 has to be programmed, the signal MSBREP_N will be at the ground voltage, and the signal LSBREP_N will be at the supply voltage Vdd.

It has to be noted that the case represented by both of the signals MSBREP_N and LSBREP_N at the ground voltage does not occur.

Subsequently, the selected (even) bit line BLe is precharged to the supply voltage Vdd in the same way as in the LSB program case.

Before applying to the selected word line WL the programming voltage VPROG (first programming pulse), the signal MLCPROG is asserted again to the supply voltage Vdd, turning on the transistors 272 and 274. Thus, the selected bit line BLe discharges to the ground voltage or not depending on the voltage values of the signals MSBREP_N and LSBREP_N (it has to be remembered that if the selected bit line BLe has a voltage equal to the supply voltage Vdd, the program is inhibited). More particularly, the selected bit line BLe discharges to the ground voltage (thus allowing to program the selected memory cell) if and only if one among the signals LSBREP_N and MSBREP_N has a voltage that is equal to the ground voltage. If the signal LSBREP_N is equal to the supply voltage Vdd, the transistor 276 turns on, and discharges the bitline. Otherwise, if the signal MSBREP_N is equal to the supply voltage Vdd, the transistor 278 turns on, and discharges the bitline. If both of the signals MSBREP_N and LSBREP_N are at the supply voltage Vdd, the selected bit line remains at the supply voltage Vdd, and the selected memory cell will not be programmed.

Even in the case of MSB program, the application to the selected word line WL of the programming voltage includes a repetition of a plurality of steps, each step including the application to the selected word line of a pulse of programming voltage VPROGR, whose value increases at each step (up to a maximum value), and then the execution of a verify phase for determining if the desired threshold voltage value has been reached. More particularly, if a memory cell has to be programmed in such a way that its threshold voltage has to reach the distribution 203 (MSB=0, LSB=0), the verify will be executed using a verify reading voltage VFY2 that has a voltage value that is slightly higher then the voltage value VREAD2. Moreover, if a memory cell has to be programmed in such a way that its threshold voltage has to reach the distribution 204 (MSB=0, LSB=1), the verify will be executed using a verify reading voltage VFY3 that has a voltage value that is slightly higher then the voltage value VREAD3.

Given that the verify operation includes a read operation, and given that a single read operation needs a latch for storing the results, in this case both the latches 230-1 and 230-2 are necessary. In fact, the latch 230-1 has the function of verifying if the threshold voltage of the corresponding memory cell has reached or not the distribution 203 (MSB=0, LSB=0). For this purpose, the signal MSBREP_N will assume the supply voltage Vdd, thus inhibiting the further programming, when the threshold voltage will reach the verify reading voltage VFY2. Furthermore, the latch 230-2 has the function of verifying if the threshold voltage of the corresponding memory cell has reached or not the distribution 204 (MSB=0, LSB=1). For this purpose, the signal LSBREP_N will assume the supply voltage Vdd, thus inhibiting the further programming, when the threshold voltage will reach the verify reading voltage VFY3.

Naturally, the MSB program operation involves all the memory cells of a selected page corresponding to a particular word line WL, and the corresponding read/program units 205. The repetition of program steps and verify steps ends when the nodes 237-1$b$ (corresponding to the signals MLSB_N) and 237-2$b$ (corresponding to the signals SLSB_N) of all the read/program units 205 of the page buffer 130 assume voltage values equal to the supply voltage Vdd. At this point, all the transistors 246 and 264 will be turned off, and the voltage values of the nodes MSBVER_N and LSBVER_N will be brought to the ground voltage by means of the highly-resistive pull down circuits PDWN.

For speeding up the MSB program operation, it is possible to stop one of the two verify operations when all the cells of the selected page are verified as correctly programmed to the state corresponding to such verify operation. More particularly, the verify operation for the distribution 203 (that makes use of the verify reading voltage VFY2) stops when the signals SMSB_N of all the read/program units 205 are at the supply voltage Vdd, while the verify operation for the distribution 204 (that makes use of the verify reading voltage VFY3) stops when the signals SLSB_N of all the read/program units 205 are at the supply voltage Vdd.

Referring to FIG. 3B, a timing diagram 330 showing a possible temporal evolution of the voltage applied to the selected word line WL during an MSB program operation (including application of programming pulses and verify operations) is illustrated. More particularly, in the example at issue, the temporal evolution of the voltage comprises twelve program voltage pulses 340(0)-340(11), the value of each program voltage pulse being higher than the value of the preceding program pulse by an amount of, e.g., 250-300 mV. After each pulse, the voltage applied to the selected word line WL is dropped to the value necessary for performing a first verify, i.e., VFY2; the voltage is illustrated in FIG. 3B by means of verify voltage pulses VP2. After the first verify, the voltage is increased to the value necessary for performing a second verify, i.e., VFY3; the voltage is illustrated in FIG. 3B by means of verify voltage pulses VP3. As in the case of the LSB program, the value of the first program voltage pulse 340(0) depends on technological process parameters, and may be determined in an empirical way. More particularly, the first voltage pulse 340(0) should have a value adapted to avoid that the threshold voltage of the fast-programming memory cells 110 of the distribution 202 exceeds the value VFY2 after application of even the first program voltage pulse. If this occurs, the threshold voltages of a number of memory cells 110 might be excessively incremented beyond the value VFY2. This will imply in turn an excessive widening of the distribution 203, that might overlap the distribution 204. Consequently, the value of the first program voltage pulse 240(0) is chosen in such a way to have a value equal to the value of the program voltage pulse 230(0) (i.e., the first program voltage pulse applied for programming the LSB) plus the difference between VFY1 and VFY2. Therefore, because a possible value for (VFY2-VFY1) is of about 1 V, in the example at issue, the value of the first program voltage is 17 V. Moreover, a possible maximum program voltage pulse value 240(11) is 20-21 V.

Referring to FIG. 4A, the possible shifts of threshold voltage experienced by a generic memory cell during an LSB program and an MSB program are depicted.

The first method of programming described enables programming an LSB and an MSB page in different, uncorrelated times. Observing FIG. 3B, it can be shown that, in the example at issue, an MSB program operation needs (in the worst case) twelve program voltage pulses 240(0)-240(11), twelve verify voltage pulses VP2 and twelve verify voltage pulses VP3. A program voltage pulse may have a duration of 30 μS (including the transients for charging and discharging the word line), and the total time necessary for programming the LSB and the MSB stored into a memory cell 110 according to the first method may be of about 1800 μS. The required programming time is thus relatively long.

An alternative, second method for carrying out a program operation is provided. The second method is not adapted to program an LSB and an MSB page in different, uncorrelated times, but enables reducing the time necessary for programming the LSB and the MSB. The second programming method will be now described in detail.

Program Operations (second method)

The second program method allows programming in a single program operation both an MSB page and the corresponding LSB page of a same set of memory cells of a selected word line WL. An external user of the memory device may, by providing a specific command to the memory device (the command is interpreted by the control unit block 135), switch the operation thereof in such a way to activate a program operation that make use of the second programming method. Once the user has selected the second programming method by providing the specific command, the user has to provide the data content to be stored in both the MSB page and the LSB page in the same time.

Referring to FIG. 3C, a timing diagram 350 showing the temporal evolution of the voltage applied to a selected word line WL during a program operation (including programming pulses and verify steps) according to the second method is illustrated. More particularly, in the example considered, the temporal evolution of the voltage comprises fifteen program voltage pulses 360(0)-360(14), the value of each program voltage pulse being higher than the value of the preceding program pulse by an amount of, e.g., 250-300 mV.

Thanks to temporal evolution illustrated in FIG. 3C, it is possible to program a selected memory cell 110, assumed to have been preliminary erased, i.e. starting from the distribution 201, in such a way that its threshold voltage is brought directly (i.e., with a single program sequence) to a desired target distribution (201, 202, 203, or 204), as depicted in FIG. 4B.

Instead, adopting the first program method described, if an erased memory cell (i.e., with threshold voltage belonging to the distribution 201) has to be programmed in such a way that its threshold voltage has to reach the distribution 203, it is firstly necessary to perform an LSB program so as to bring the cell into the distribution 202, and then an MSB program has to be performed, preceded by an LSB read, to bring the cell into the distribution 203. Thus, in the first method, two distinct program operations, with an intermediate LSB read, have to be performed even if the target LSB and MSB values are known from the very beginning.

Referring back to FIG. 3C, it is possible to show that the voltage temporal evolution illustrated in the timing diagram 350 is obtained by overlapping the voltage temporal evolution of an MSB program operation to that of an LSB program operation. More particularly, according to the example at issue, the two voltage temporal evolutions are overlapped in such a way that the program voltage pulse 320(3) of the LSB program operation coincides with the program voltage pulse 340(0) of the MSB program operation (in fact, they are such to have a same voltage value).

After each one of the pulses 360(0)-360(2) (corresponding to the program voltage pulses 320(0)-320(2) of FIG. 3A), the voltage applied to the selected word line WL is dropped to the value VFY1, necessary for performing a first verify. Moreover, after each one of the pulses 360(3)-360(10) (obtained by the overlapping of the program voltage pulses 320(3)-320(10) of FIG. 3A and the program voltage pulses 340(0)-340(7) of FIG. 3B), the voltage applied to the selected word line WL is firstly dropped to the value necessary for performing a first verify, i.e., VFY1, then increased to the value necessary for performing a second verify, i.e., VFY2, illustrated in FIG. 3C by means of verify voltage pulses VP2, and then further increased to the value necessary for performing a third verify, i.e., VFY3; the voltage is illustrated in FIG. 3C by means of verify voltage pulses VP3. The three different verifies are all necessary because of the abovementioned overlapping of program pulses: the first verify originates from the temporal evolution illustrated in FIG. 3A, the second and the third verify originate from the temporal evolution illustrated in FIG. 3B. After each one of the pulses 360(11)-360(14), the voltage applied to the selected word line WL is firstly dropped to the value VFY2, necessary for performing a first verify (illustrated in FIG. 3C by means of verify voltage pulses VP2), and then increased the value VFY3, necessary for performing a second verify (illustrated in FIG. 3C by means of verify voltage pulses VP3).

By comparing the timing diagrams 310 and 330 with the timing diagram 350, it can be appreciated that the worst-case overall number of program voltage pulses used in the second program method is lower than the number used for the first program method, while the number of verify steps is the same. More particularly, according to the first programming method described above, in the example at issue 23 program voltage pulses are necessary, eleven pulses 230(0)-230(10) for performing an LSB program operation, plus twelve pulses 250(0)-250(11) for performing an MSB program operation. Contrarily, according to the second method, in the example at issue only fifteen program voltage pulses 360(0)-360(14) are necessary for programming the LSB and the MSB. Thus, in this case, eight program voltage pulses are saved, allowing a reduction of the time required by the program operation. Given that, according to this example, a program voltage pulse has a typical duration of 30 µS, saving seven program voltages implies a reduction in time of 7*30=210 µS, i.e. about 15% of the total time (1800 µS) necessary for programming the MSB and the LSB according to the first method.

Referring back to FIG. 2B, a first embodiment of page buffer 130 adapted to implement the second program method is depicted, and will be hereinbelow described.

During a program operation performed using the second method, the two latches 230-1 and 230-2 are directly loaded with the information regarding the target logic values of the LSB and the MSB of the selected memory cell 110: firstly, the latch 230-2 is loaded with the target LSB and then the latch 230-1 is loaded with the target MSB value. More particularly, considering the latch 230-1, the voltage value assumed by the node 237-1*b*, i.e., the value of the signal SMSB_N, corresponds to the target MSB value: if the signal SMSB_N is at the supply voltage Vdd, it means that the target MSB value is "1", otherwise, if the signal SMSB_N is at the ground voltage, it means that the target MSB value is "0". Considering the latch 230-2, the voltage value assumed by the node 237-2*b*, i.e., the value of the signal SLSB_N, corresponds to the target LSB value: if the signal SLSB_N is at the supply voltage Vdd, it means that the target LSB value is "1", otherwise, if the signal SLSB_N is at the ground voltage, it means that the target LSB value is "0". It can be appreciated that for programming an MSB and an LSB in a single program sequence, at least two latches per read/program unit 205 are needed, one for storing the information regarding the target MSB value, and one for storing the information regarding the target LSB value.

Firstly, the information about the target MSB and LSB values is loaded into the latches 230-1 and 230-2, respectively. This operations is essentially similar to the load operations previously described in detail in connection with the first programming method.

As previously described in greater detail, when a programming voltage pulse is applied to a selected word line WL, the selected memory cell 110 belonging to the thereto is programmed (i.e., its threshold voltage value is incremented) depending on the voltage value of the corresponding bit line. More particularly, after having been precharged to the supply voltage Vdd the corresponding bit line is discharged if the selected memory cell 110 has to be programmed, or maintained to the supply voltage Vdd if the selected memory cell 110 has not to be programmed.

After the application of each program voltage pulse, at least one verify is performed, using one among the two latches 230-1, 230-2, depending on the verify reading voltage (VFY1, VFY2 or VFY3) that is exploited, as will be described in greater detail later on. If the verify is passed, i.e., if the threshold voltage of the selected memory cell 110 exceeds the verify reading voltage (VFY1, VFY2 or VFY3, depending on the verify performed), the content of the latch is changed (more particularly, the signal SLSB_N or the signal SMSB_N are driven to the supply voltage Vdd), in such a way to inhibit any further programming step on the selected memory cell.

During a program operation performed using the second method, it is important to avoid possible "false verifies", i.e. changes of the content of one or the other of the latches 230-1 and 230-2, as a consequence of a verify considered passed even in respect of those memory cells that have not yet reached the target programming state, because this would inhibit further programming steps to the cells. In particular, Two different false verifies can be defined, one in connection with the verify reading voltage VFY1, and one in connection with the verify reading voltage VFY2.

More particularly, when the latch 230-2 stores the logic value "0" (the signal SLSB_N is at the ground voltage), i.e., when the LSB has to be programmed to the logic value "0", the threshold voltage value of the selected memory cell 110 has to be brought to the distribution 202 or the distribution 203. In fact, both the distributions 202 and 203 correspond to LSB=0. During the program phase, the threshold voltage value of the selected cell is progressively increased; when the threshold voltage reaches the distribution 202, a verify operation exploiting the verify reading voltage VFY1 is passed. Consequently, the node SO is maintained to the supply voltage Vdd, and the signal SLSB_N is driven to the supply voltage Vdd. In this way, any further programming step on the selected memory cell is inhibited. However, this is correct only if the selected memory cell has to be programmed to the distribution 202, corresponding to LSB=0 and MSB=1; conversely, if the selected memory cell has to be programmed so as to have LSB=0 and MSB=0, inhibiting the application of further programming pulses to such a cell is not correct, because the threshold voltage value needs to be further increased, up to the distribution 203. Therefore, it is necessary to recognize, once a verify operation exploiting the verify reading voltage VFY1 has been passed, if such a result has to be taken into account (case of distribution 202, LSB=0, MSB=1), or has to be ignored (first false verify, case of distribution 203, LSB=0, MSB=0). It is observed that this problem is due to the fact that the information regarding the target distribution in which the threshold voltage value of the selected memory cell has to be brought is in part stored in the latch 230-2, and in part stored in the latch 230-1.

Similarly, when the latch 230-1 stores the logic value "0" (the signal SMSB_N is at the ground voltage), i.e., when the MSB has to be programmed to the logic value "0", the threshold voltage value of the selected memory cell 110 has to be brought into the distribution 203 or the distribution 204. In fact, both the distributions 203 and 204 correspond to MSB=0. During the program phase, the threshold voltage value of the selected cell is progressively increased, and when it reaches the distribution 203, a verify operation exploiting the verify reading voltage VFY2 is passed. Consequently, the node SO is maintained to the supply voltage Vdd, and the signal SMSB_N is driven to the supply voltage Vdd. In this way, any further programming step on the selected memory cell is inhibited. This is correct only if the selected memory cell has to be programmed to the distribution 203, corresponding to LSB=0 and MSB=0; conversely, if the memory cell has to be programmed so that LSB=1 and MSB=0, it is not correct to inhibit the application of further programming steps, because the threshold voltage value has to be further increased, toward the target distribution 204. Therefore, it is necessary to recognize, once a verify operation exploiting the verify reading voltage VFY2 is passed, whether the result has to be taken into account (case of distribution 203, LSB=0, MSB=0), or has to be ignored (second false verify, case of distribution 204, LSB=1, MSB=0).

In order to overcome the false verify problems just discussed, each read/program unit 205 included in the page buffer 130 should allow, during a program operation, the discharge of the node SO (and consequently, the application of further programming voltage pulses) whenever a false verify occurs. In other words, each read/program unit 205 has to include means adapted to drive toward the ground voltage the corresponding node SO in such a way as to override the results of a verify (as if the verify did not pass) whenever a false verify occurs.

For this purpose, in the first embodiment of FIG. 2B, the read/program unit 205 further includes three series-connected N-channel MOS transistors 288, 289, 290 that are used during a program operation for selectively discharging the corresponding bit line to the ground voltage, when both the signals SLSB_N and SMSB_N have voltage values equal to the ground voltage. More particularly, the transistor 288 has the drain terminal connected to the node SO, the gate terminal controlled by a program discharge signal DPPGM, and the source terminal connected to the drain terminal of the transistor 289. The transistor 289 has the gate terminal controlled by the signal SLSB and the source terminal connected to the drain terminal of the transistor 290. The transistor 290 has the gate terminal controlled by the signal SMSB and the source terminal connected to the node 237-1c.

Moreover, two N-channel MOS transistors 291, 292 are used for selectively discharging the node SO during a verify performed using the information stored in the latch 230-2, as will be more clear in the following. More particularly, the transistor 291 has the drain terminal connected to the node SO, the gate terminal controlled by an LSB discharge signal DPPLSB, and the source terminal connected to the drain terminal of the transistor 292. The transistor 292 has the gate terminal controlled by the signal SMSB, and the source terminal connected to a terminal providing the ground voltage.

Two N-channel MOS transistors 293, 294 are used for selectively discharging the node SO during a verify performed using the information stored in the latch 230-1, as will be more clear in the following. More particularly, the transistor 293 has the drain terminal connected to the node SO, the gate terminal controlled by an MSB discharge signal DPPMSB, and the source terminal connected to the drain terminal of the transistor 294. The transistor 294 has the gate terminal controlled by the signal SLSB_N, and the source terminal connected to a terminal providing the ground voltage.

Thus, the (possible) discharging of the bit line before each program voltage pulses is accomplished driving to the supply voltage the program discharge signal DPPGM and MLCPROG. The bit line does not discharge only in case the selected cell has to be programmed with LSB=MSB=1 (i.e., when its threshold voltage has to remain in the distribution 201). In fact, in this case, both the signals SLSB_N and SMSB_N are at the supply voltage Vdd. Conversely, in all the other cases (LSB=0, MSB=1; LSB=0, MSB=0; LSB=1, MSB=0), the corresponding bit line discharges, because at least one among the signals SLSB_N or SMSB_N is at the ground voltage.

Having applied a program voltage pulse 360(0)-360(15) to the selected word line WL, a verify operation is performed, exploiting one, two or all of the verify reading voltages VFY1, VFY2, VFY3, depending on which program voltage pulse 360(0)-360(15) has been applied, i.e. on the state of progress of the program operation.

When the verify is performed exploiting the verify reading voltage VFY1 (after the program voltage pulses from 360(0) to 360(10)), the latch 230-2 is used, that stores the LSB value. As in the case of the first method previously described, the verify is started by asserting to the supply voltage Vdd the signal LSBREAD1 controlling the gate of the transistor 256. In this way, the signal SLSB is driven to the ground voltage (thus inhibiting the application of further programming voltage pulses) if the threshold voltage value of the selected cell has exceeded the verify reading voltage VFY1. To avoid the occurrence of first false verifies, before asserting to the supply voltage Vdd the signal LSBREAD1, the LSB discharge signal DPPLSB is asserted to Vdd. Consequently, the node SO discharges if and only if the signal SMSB_N is at the ground voltage (the transistors 291 and 292 are turned on). This, in fact, means that the target MSB value is 0, corresponding to a desired threshold voltage value belonging to the distributions 203 or 204. Thus, the node SO remains charged at the supply voltage (program inhibited) if and only if the threshold voltage of the selected memory cell 110 has to be programmed toward the distribution 202, and its value has exceeded the verify reading voltage VFY1. In all the others cases, the node SO discharges.

When the verify is performed exploiting the verify reading voltage VFY2 (after the program voltage pulses from 360(4) to 360(15)), the latch 230-1 is used, that stores the MSB value. As in the case of the first method previously described, the verify is started by asserting to the supply voltage Vdd the signal MSBREAD controlling the gate of the transistor 242. In this way, the signal SMSB is driven to the ground voltage (inhibiting thus the application of further programming voltage pulses) if the threshold voltage value of the selected cell has exceeded the verify reading voltage VFY2. To avoid the occurrence of second false verifies, before asserting to the supply voltage Vdd the signal MSBREAD, the MSB discharge signal DPPMSB is asserted to Vdd. Consequently, the node SO discharges if and only if the signal SLSB_N is at the supply voltage Vdd (the transistors 293 and 294 are turned on). This, in fact, means that it is desired an LSB with a logic value equal to 1, corresponding to a desired threshold voltage value belonging to the distributions 201 or 204. Thus, the node SO remains charged at the supply voltage (program inhibited) if and only if the threshold voltage of the selected memory cell 110 has to be programmed toward the distribution 203, and its value has exceeded the verify reading voltage VFY2. In all the others cases, the node SO discharges.

After the program voltage pulses from 360(4) to 360(15), the verify is performed exploiting the verify reading voltage VFY3 (also in this case the latch 230-1 is used and the verify is started by asserting to the supply voltage Vdd the signal MSBREAD controlling the gate of the transistor 242). In this case, no false verifies occurs.

Figure 5:
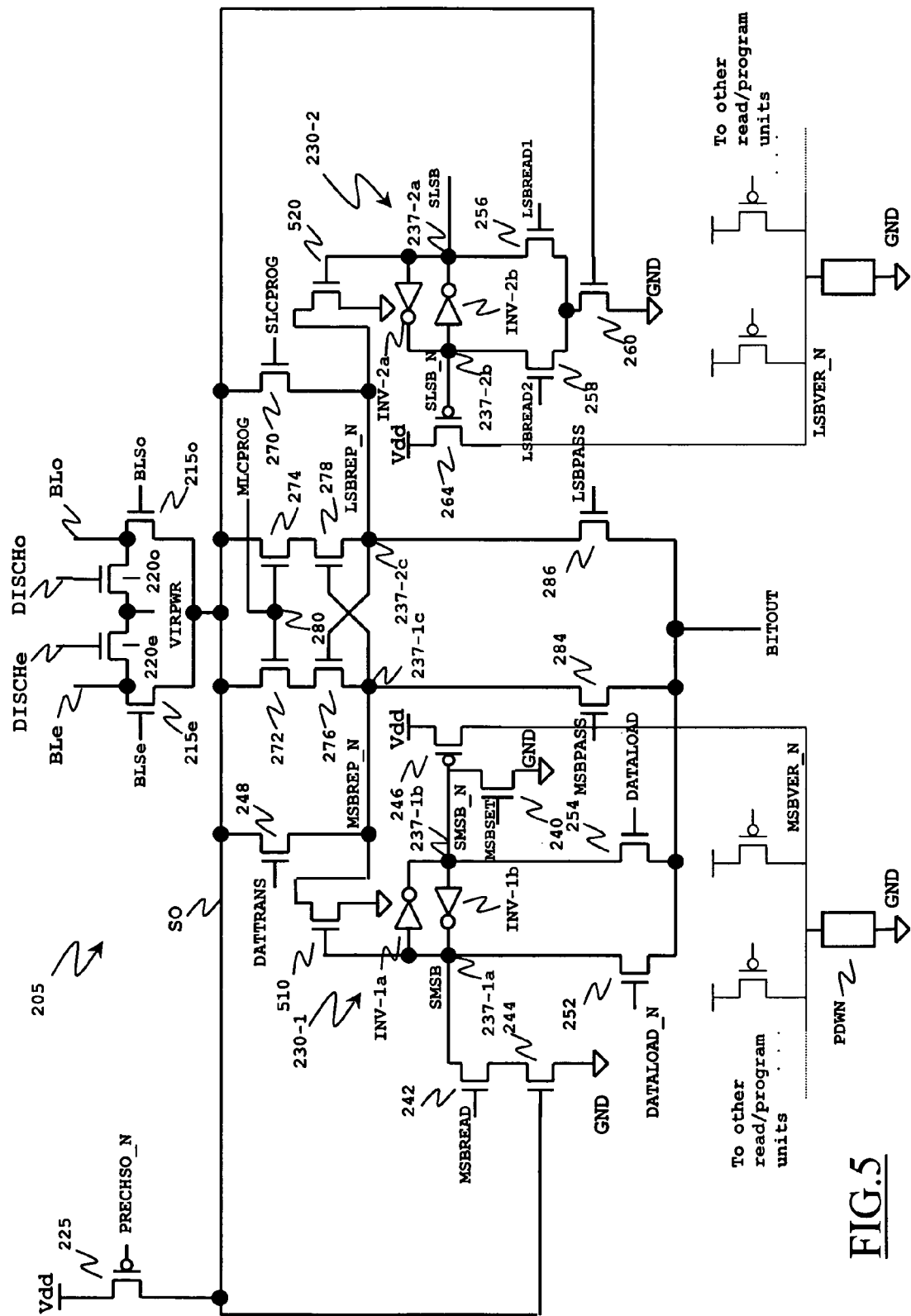
FIG. 5 illustrates a circuital view of a read/program unit included in the page buffer of the memory device, according to a second embodiment of the present invention.

Referring now to FIG. 5, a read program/unit 205 included in the page buffer 130 is illustrated, according to a second embodiment of the present invention.

According to this embodiment, it is possible to simplify the circuital structure of the read/program unit 205 adapted to perform program operations according to the second method previously described.

The read/program unit 205 of FIG. 5 is essentially equal to the read/program unit 205 of FIG. 2B. The only differences consist in the fact that in FIG. 5 the transistors 291, 292, 293, 294 are not present, and the inverters INV-1*c* and INV-2*c* are replaced by two N-channel MOS transistors 510 and 520, respectively.

More particularly, the transistor 510 has the drain terminal connected to the node 237-1*c*, the gate terminal connected to the node 237-1*a*, and the source terminal connected to a terminal providing the ground voltage. The transistor 520 has the drain terminal connected to the node 237-2*c*, the gate terminal connected to the node 237-2*a*, and the source terminal connected to a terminal providing the ground voltage. Thanks to the circuital structure of this embodiment, it is possible to execute the program operations according to the second method utilizing a lower number of transistors respect to the case of the first embodiment.

The operation of the read/program unit 205 of FIG. 5 is analogous to the one of the read/program unit of FIG. 2B. In this case, the LSB discharge signal DPPLSB is substituted by the signal DATTRANS, and the MSB discharge signal DPPMSB is substituted by the signal SLCPROG.

Compared to the one of the first embodiment, the read/program unit 205 of this second embodiment includes a lower number of transistors. However, a possible disadvantage of this solution consists in the fact that during a data out procedure, i.e., when data stored in a read memory cell 110 is provided to the output of the page buffer 130 (by means of the transistors 284, 286) toward the I/O buffers 140, the I/O data line BITOUT needs to be precharged to the supply voltage Vdd. In fact, in the read/program unit 205 of this second embodiment, the inverters INV-1*c* and INV-2*c* are replaced by two N-channel MOS transistors 510, 520 that have the capability to discharge a node toward the ground voltage, but not the capability to bring it to the supply voltage Vdd.

Figure 6:
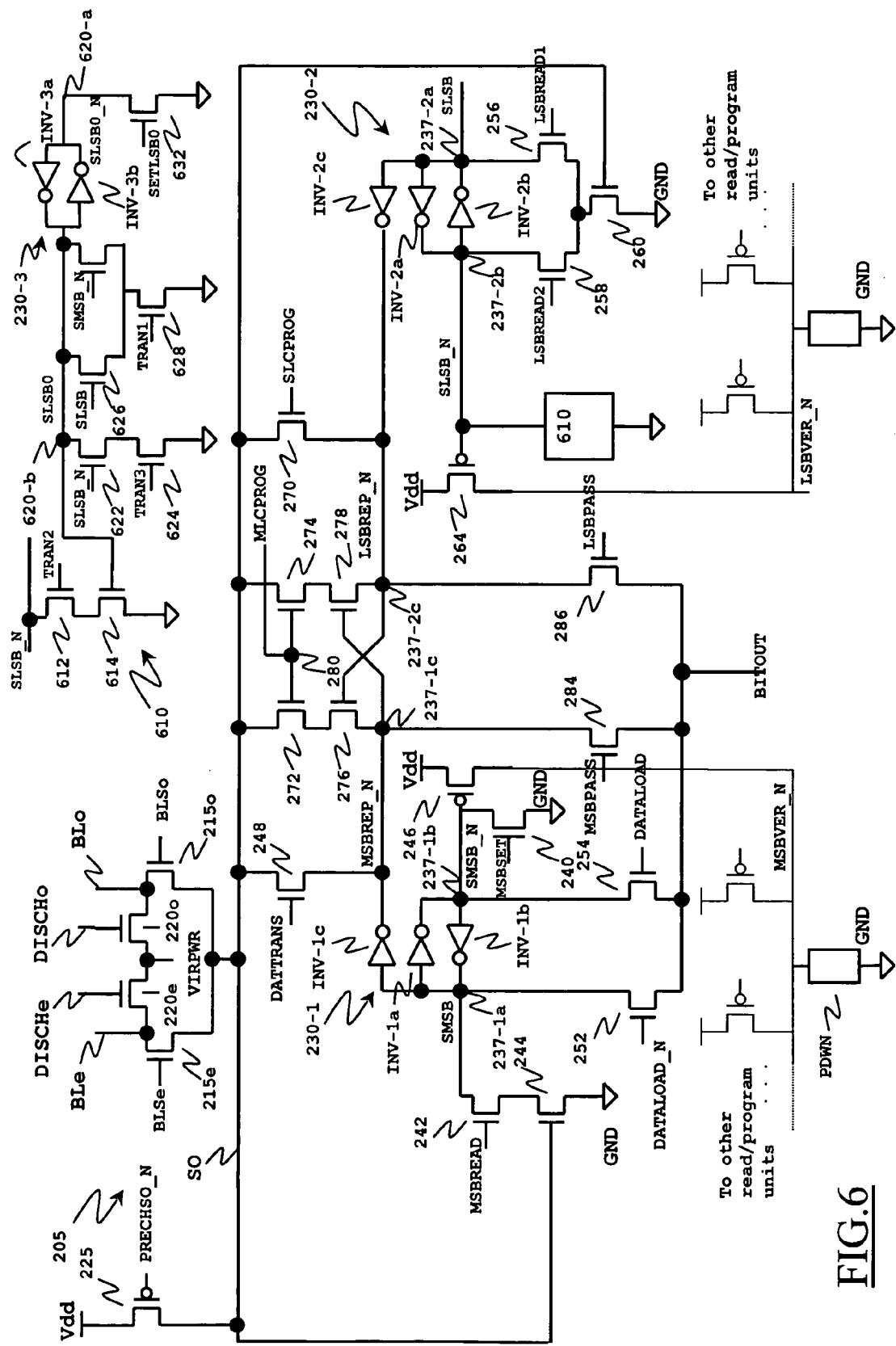
FIG. 6 illustrates a circuital view of a read/program unit included in the page buffer of the memory device, according to a third embodiment of the present invention.

Referring now to FIG. 6, a read program/unit 205 included in the page buffer 130 is illustrated, according to a third embodiment of the present invention.

According to this embodiment, it is possible to perform program operations according to the second method (i.e., program an LSB page and an MSB page in a same time) using performing operations similar to those described in connection with the first method previously described.

The read/program unit 205 of FIG. 6 is substantially equal to the read/program unit 205 of FIG. 2B. The only differences consist in the fact that in the read/program unit 205 of FIG. 6 there is included a latch circuital block 610 connected between the node 237-2*b* and a terminal providing the ground voltage.

More particularly, the latch circuital block 610 includes an N-channel MOS transistors 612, having the drain terminal connected to the node 237-2*b*. a gate terminal controlled by a signal TRAN2, and the source terminal connected to the drain terminal of an N-channel MOS transistor 614. The transistor 614 has the gate terminal connected to a node 620-*b*, and the source terminal connected to a terminal providing the ground voltage. Moreover, a N-channel MOS transistor 622 has the drain terminal connected to the node 620-*b*, the gate terminal controlled by the signal SLSB_N, and the source terminal connected to the drain terminal of an N-channel MOS transistor 624. The transistor 624 has the gate terminal controlled by a signal TRAN3, and the source terminal connected to a terminal providing the ground voltage. A further N-channel MOS transistor 626 has the drain terminal connected to the node 620-*b*, the gate terminal controlled by the signal SLSB, and the source terminal connected to the drain terminal of an N-channel MOS transistor 628. The transistor 628 has the gate terminal controlled by a signal TRAN1, and the source terminal connected to a terminal providing the ground voltage. A still further N-channel MOS transistor 630 has the drain terminal connected to the node 620-*b*, the gate terminal controlled by the signal SMSB_N, and the source terminal connected to the drain terminal of the transistor 628. Furthermore, the latch circuital block 610 includes a latch 230-3, formed by two inverters INV-3*a* and INV-3*b*, connected in a loop with the input terminal of the inverter INV-3*a* connected to the output terminal of the inverter INV-3*b* so as to define a node 620-*a*, providing a signal SLSBO_N, and the output terminal of the inverter INV-3*a* connected to the input terminal of the inverter INV-3*b* so as to define the node 620-*b*, providing a signal SLSBO that is the logic complement of the signal SLSBO_N. An N-channel MOS transistor 632 has the drain terminal connected to the node 620-*a*, the gate terminal controlled by a signal SETLSBO, and the source terminal connected to a terminal providing the ground voltage.

As will be made clearer in the following, the introduction of the third latch 230-3 allows to program both an LSB and an MSB page using a single sequence of program voltage pulses (as in FIG. 3C), and using the program operations previously described in the section relating the first program method.

Even in this case, the two latches 230-1 and 230-2 are used for being directly loaded with the information regarding the target LSB and the MSB logic values of the selected memory cell 110: the purpose of the latch 230-1 is to store the target MSB value, while the purpose of the latch 230-2 is to store the target LSB value. More particularly, referring to the latch 230-1, the voltage value assumed by the node 237-1 b, i.e., the value of the signal SMSB_N, corresponds to the desired MSB value to be programmed: if the signal SMSB_N is at the supply voltage Vdd, the MSB has to be programmed to the logic value "1", otherwise, if the signal SMSB_N is at the ground voltage, the MSB has to be programmed to the logic value "0". Referring to the latch 230-2, the voltage value assumed by the node 237-2*b*, i.e., the value of the signal SLSB_N, corresponds to the desired LSB value to be programmed: if the signal SLSB_N is at the supply voltage Vdd, the LSB has to be programmed to the logic value "1", otherwise, if the signal SLSB_N is at the ground voltage, the LSB has to be programmed to the logic value "0". It is important to note that for programming an MSB and an LSB in a single program operation, at least two latches per read/program unit 205 are needed, one for storing a bit of information regarding the desired MSB value, and one for storing a bit of information regarding the desired LSB value.

Consequently, a program operation firstly calls for loading into the latches 230-1 and 230-2 the target LSB and MSB logic values. The operations to be performed are not described in detail, for the sake of the brevity, beings essentially similar to those ones previously described in connection with the first programming method.

After having loaded the target MSB and LSB values, the signal SLSBO is set to the supply voltage Vdd. For this purpose, the signal SLSBO_N is driven to the ground voltage by asserting the signal SETLSBO to the supply voltage Vdd, turning on the transistor 632. Subsequently, the signal TRAN1 is asserted to the supply voltage Vdd. In this way, the signal SLSBO remains at the supply voltage Vdd if and only if the desired distribution in which the threshold voltage value of the selected memory cell has to be programmed is the distribution 204 (MSB=0, LSB=1). In fact, if at least one among the transistors 626 and 630 is turned on (the transistor 626 turns on when the signal SLSB is at the supply voltage Vdd, and the transistor 630 turns on when the signal SMSB_N is at the supply voltage Vdd), the node 620-b is discharged to the ground voltage.

Subsequently, an LSB to MSB data transfer from the latch 230-2 to the latch 230-1 is performed, by asserting the signal SLCPROG to the supply voltage Vdd.

Then, an MSB to LSB data transfer from the latch 230-1 to the latch 230-2 is performed, by asserting the signal MLCPROG to the supply voltage Vdd. Also in this case, the operation is performed in the same way as in the case illustrated referring to the first program method.

As a consequence of these two data transfers, the signal SMSB_N at the node 237-1*b* is at the ground voltage if and only if the target threshold voltage distribution for the selected memory cell is the distribution 203 (MSB=0, LSB=0); in the other cases, the signal SMSB_N is at the supply voltage Vdd.

Moreover, the signal SLSB_N at the node 237-2*b* is at the ground voltage if and only if the target threshold voltage value distribution for the selected memory cell is the distribution 202 (MSB=1, LSB=0); in the other cases, the signal SLSB_N is at the supply voltage Vdd.

At this point, the latch 230-1 stores the information indicative of the fact that the target distribution is the distribution 203, the latch 230-2 stores the information indicative of the fact that the target distribution is the distribution 202, and the latch 230-3 stores the information indicative of the fact that the target distribution is the distribution 204.

Before the application of any program voltage pulse to the selected word line WL, the signal TRAN2 is asserted to the supply voltage Vdd. Consequently, the node 237-2*b* will be brought to the ground voltage if and only if the signal SLSBO is at the supply voltage (i.e., the target distribution is the distribution 204). Moreover, by asserting the signal MLCPROG to the supply voltage Vdd, the node SO discharges to the ground voltage if and only if the signal SLSB_N is at the ground voltage, or the signal SMSB_N is at the ground voltage, that is, only if the target threshold voltage value distribution for the selected memory cell is one among the distributions 202, 203, or 204.

After the previous preparation operations, the program voltage pulse is applied to the selected word line WL, and the related verifies are performed, exploiting one, two or all among the verify reading voltages VFY1, VFY2, VFY3, depending on which program voltage pulse 360(0)-360(15) has been applied, i.e. on the state of progress of the program operation.

When the verify is performed exploiting the verify reading voltage VFY1 (after the program voltage pulses from 360(0) to 360(10)), the latch 230-2 is used, that stores the LSB value. As in the previous cases, the verify is started by asserting to the supply voltage Vdd the signal LSBREAD1 controlling the gate of the transistor 256. If the threshold voltage value of the selected cell has reached the distribution 202, the signal SLSB_N is brought to the supply voltage Vdd. It has to be noted that also in this case a false verify may occur. In fact, a memory cell which has to be programmed so that its threshold voltage reaches the distribution 204, will firstly reach the verify reading voltage VFY1, thus bringing the signal SLSB_N to the supply voltage Vdd. However, the information about whether or not to continue applying further programming voltage pulses is stored in the latch 230-3. At the end of the verify at the verify reading voltage VFY1, the signal TRAN2 is asserted again to the supply voltage Vdd, bringing the signal SLSB_N to the ground voltage if and only if the target threshold voltage value distribution for the selected memory cell is the distribution 204.

It has to be noted that before the last operation (the assertion of the signal TRAN2), if the node LSBVER_N is at the ground voltage (meaning that all the memory cells whose threshold voltages has to be programmed in the distribution 202 or 204 have their threshold voltages that have exceeded the verify reading voltage VFY1), it is possible to exclude in the subsequent steps any further verify operation at the verify reading voltage VFY1.

When the verify is performed exploiting the verify reading voltage VFY2 (after the program voltage pulses from 360(4) to 360(15)), the latch 230-1 is used, that stores the MSB value. As in the previous cases, the verify is started by asserting to the supply voltage Vdd the signal MSBREAD controlling the gate of the transistor 242. This verify is relatively easy, because the signal SMSB_N is at the ground voltage if the target threshold voltage value for the selected memory cell is the distribution 203, a situation that is verified with the verify reading voltage VFY2. When the threshold voltage value of the selected memory cell 110 exceeds the verify reading voltage VFY2, the signal SMSB_N is driven to the supply voltage Vdd.

If the node MSBVER_N is at the ground voltage (meaning that all the memory cells whose threshold voltages has to be programmed in the distribution 203 have their threshold voltages that have exceeded the verify reading voltage VFY2), it is possible to exclude in the subsequent steps any further verify operation at the verify reading voltage VFY2.

When the verify is performed exploiting the verify reading voltage VFY3 (after the program voltage pulses from 360(4) to 360(15)), the latch 230-2 is used, that stores the LSB value. As in the previous cases, the verify is started by asserting to the supply voltage Vdd the signal LSBREAD1 controlling the gate of the transistor 256. If the threshold voltage value of the selected cell has reached the distribution 204, the signal SLSB_N is brought to the supply voltage Vdd. At this point, the signal TRAN3 is asserted to the supply voltage Vdd. Thus, the signal SLSBO is brought to the ground voltage if and only if the signal SLSB_N is at the supply voltage Vdd. In this way, the signal SLSB_N is not brought to the ground voltage by asserting the signal TRAN2 to the supply voltage before the application of a further program voltage pulse. Consequently, the discharge toward the ground voltage is avoided in respect of the bit line corresponding to a memory cell having its threshold voltage value that has already reached the distribution 204, thus inhibiting any further increment thereof. In fact, as previously mentioned, the setting of the signal SLSB_N by means of the assertion of the signal TRAN2 is executed every time before the application of each program voltage pulse.

If the node LSBVER_N is at the ground voltage (meaning that all the memory cells whose threshold voltages has to be programmed in the distribution 204 have their threshold voltages that have exceeded the verify reading voltage VFY3), it is possible to exclude in the subsequent steps any further verify operation at the verify reading voltage VFY3.

The programming sequence terminates when the verifies of all the distributions 202, 203 and 204 are passed, i.e., when the node MSBVER_N is at the ground voltage after a verify operation performed exploiting the verify reading voltage VFY2, and the node LSBVER_N is at the ground voltage after a verify operation performed exploiting the verify reading voltage VFY1 and a verify operation performed exploiting the verify reading voltage VFY3.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible. Moreover, it is expressly intended that specific elements and/or method steps described in connection with any disclosed embodiment of the invention may be incorporated in any other embodiment as a general matter of design choice. Memory Devices including embodiments of the present invention may be contained in a variety of different types of electronic devices, such as computer systems, cellular phones, personal digital assistants, digital cameras, and so on.

For example, the three embodiments of the read/program unit previously described hereinbefore are not to be considered as limitative, being possible to realize other different structures adapted to program in a single program operation both an MSB page and the corresponding LSB page.

From the foregoing it will be appreciated that, although specific embodiments of the invention have been described herein for purposes of illustration, various modifications may be made without deviating from the spirit and scope of the invention.

The invention claimed is:

1. In an electrically programmable memory including a plurality of memory cells arranged in individually-selectable memory cell sets each including at least one memory cell, a plurality of distinct memory cell programming states corresponding to a number N>=2 of data bits storable in each memory cell, wherein the data bits include at least a first data bits group and a second data bits group, the first data bits groups and, respectively, the second data bits groups stored in the memory cells of one of said individually-selectable memory cell sets forming at least a first memory page and a second memory page, respectively, the first and second memory pages being individually addressable, a programming method comprising:
    causing the memory cells of a selected memory cells set to be brought into a predetermined, starting programming state;
    receiving a target value for the first data bits groups of the memory cells of the selected memory cells set;

receiving a target value for the second data bits groups of the memory cells of the selected memory cells set;

after having received the target values of both the first and the second data bits groups, applying to the memory cells of the selected memory cells set a programming sequence adapted to cause the memory cells of the selected memory cells sets to be brought into a target programming state—jointly determined by the target values of the first and second data bits groups.

2. The method of claim 1, in which said programming sequence—includes repeatedly applying a plurality of program pulses—to the memory cell—of the selected memory cells set, and verifying a reached programming state thereof, said verifying being adapted to provide at least a first and second verify results, the first verify result indicating whether the first group of data bits—has reached the first target value, and the second verify result indicating whether the second group of data—bits has reached the second target value, wherein the first verify result is conditioned by the second target value, and vice versa.

3. The method according to claim 2, in which said memory cells—includes controlled electronic devices having a threshold turn-on voltage, said programming states—correspond to respective ranges of the threshold turn-on voltage, with a lowest programming state—corresponding to a range of threshold voltage values lower than the values of the other threshold voltage ranges, and a highest programming state—corresponding to a range of threshold voltage values higher than the values of the other threshold voltage ranges, said predetermined starting programming state corresponding to a selected one among the lowest or the highest programming states.

4. The method of claim 3, in which said repeatedly applying includes progressively increasing a programming voltage—applied to an electric terminal of the memory cells—of the selected memory cells set, a value of the programming voltage of a prescribed number of initial program pulses being adapted to cause the programming state—of the memory cells to move from the starting programming state to the adjacent programming state.

5. The method of claim 4, in which verifying a reached programming state includes assessing the reached programming state after each program pulse.

6. The method according to claim 5, in which said assessing the reached programming state includes reading a content of the memory cells by applying to the electric terminal thereof a verify read voltage—depending on the target programming state.

7. The method according to claim 6, in which assessing the reached programming state includes, for a generic memory cell—of the selected memory cells group to be brought into a programming state different—than the starting programming state:

performing a first verify by reading the memory cell with a first verify read voltage—adapted to determine whether a first programming state adjacent—to the starting programming state has been reached;

determining whether to stop or continue applying the program pulses to the generic memory cell depending on the target value for the second data bits group, so that a result of the first verify is not only determined by a result of the first verify read;

in case the applying the program pulse has to continue, performing a second verify by reading the memory cell with a second verify read voltage—adapted to determine whether a second programming state adjacent to the first programming state—has been reached;

determining whether to stop or continue applying the program pulses to the generic memory cell depending on the target value for the first data bits group, so that a result of the second verify is not only determined by a result of the second verify read; and in case the applying the program pulse has to continue, reading the memory cell with a third verify read voltage—adapted to determine whether the highest programming state—has been reached.

8. An electrically programmable memory—including a plurality of memory cells—arranged in individually-selectable memory cell sets each including at least one memory cell, a plurality of distinct memory cell programming states—corresponding to a number N>=2 of data bits storable in each memory cell, wherein the data bits include at least a first data bits group and a second data bits group, the first data bits groups and, respectively, the second data bits groups stored in the memory cells of one of said individually-selectable memory cell sets forming at least a first memory page and a second memory page, respectively, the first and second memory pages being individually addressable, the—electrically programmable further including:

means for causing the memory cells of a selected memory cells set to be brought into a predetermined, starting programming state;

means for receiving a target value for the first data bits groups of the memory cells of the selected memory cells set;

means for receiving a target value for the second data bits groups of the memory cells of the selected memory cells set;

means for applying to the memory cells of the selected memory cells set a programming sequence adapted to cause the memory cells of the selected memory cells sets to be brought into a target programming state—jointly determined by the received target values of the first and second data bits groups.

9. The electrically programmable memory—of claim 8, wherein said means for applying the programming sequence includes means for repeatedly applying a plurality of program pulses—to the memory cell—of the selected memory cells set, and means for verifying a reached programming state—thereof, said verifying means being adapted to provide at least one verify result indicating whether the memory cells of the selected memory cells sets are brought into the target programming state, the electrically programmable memory comprising a page buffer including:

first latch means—adapted to receive and latch the target value for the first data bits groups;

second latch means—adapted to receive and latch the target value for the first data bits groups;

enabling means for selectively enabling the application to the memory cells of the selected memory cells set the program pulses depending on the target values for both the first and the second data bits groups in function of the at least one verify result.

10. The electrically programmable memory—of claim 9, wherein the enabling means includes false-verify preventing means adapted to override an incorrect verify result in case the memory cells—of the selected memory cells sets have not yet reached the target programming state.

11. The electrically programmable memory—of claim 10, comprising state-affecting means adapted to affect a state of the first—or the second latch in case at least one respective verify, corresponding to the reaching by the memory cells of at least one respective programming state, is passed.

12. The electrically programmable memory—of claim 11, in which said false-verify preventing means are adapted to prevent said state-affecting means from affecting the state of the respective latch in case of false verify.

13. A method of programming multi-level memory cells, the memory cells being arranged in individually-selectable memory cell sets and each memory cell operable to store at least two data bits, the method comprising:
   programming the memory cells of a selected memory cell set to an initial programming state;
   for a selected memory cell set, latching target values for the data bits to be stored in the memory cells; and
   applying to the memory cells of the selected memory cell set a sequence of programming voltages to program the memory cells of the set to a desired programming state, the programming state having a value that is a function of the target values for the data bits.

14. The method of claim 13 wherein the sequence of programming voltages comprises:
   repeatedly applying a plurality of program voltage pulses to the memory cells of the selected memory cell set;
   verifying a programming state of the memory cells by providing at least first and second verify results, the first verify result indicating whether a first group of data bits has reached the corresponding target value and the second verify result indicating whether the second group of data bits has reached the corresponding target value, with each verify result being a function of the target value of the other group of data bits.

15. The method of claim 14 wherein each memory cells has an associated threshold voltage, and wherein the programming states of each memory cell correspond to respective ranges of the threshold voltage of the cell, and wherein for each memory cell the initial programming state corresponds to one of a lowest or a highest threshold voltage of the cell.

16. The method of claim 15, in which the repeatedly applying a plurality of program voltage pulses includes progressively increasing a programming voltage applied to each memory cell of the selected memory cell set, a value of the programming voltage of a prescribed number of program voltage pulses programming memory cells from a first programming state to an adjacent programming state.

17. A non-volatile memory device, comprising:
   at least one memory-cell matrix, the memory-cell matrix including a plurality of multi-level memory cells arranged in rows and columns and the memory cells being arranged in individually-selectable memory cell sets;
   an address decoder coupled to the matrix of memory cells and adapted to receive a memory address, the address decoder operable to decode the address and provide decoded row address signals to access corresponding memory cells in the array; and
   a page buffer coupled to the memory-cell matrix, the page buffer being operable to program the memory cells of a selected memory cell set to an initial programming state and to latch target values for the data bits to be stored in the memory cells of a selected memory cell set, and the page buffer further operable to applying a sequence of programming voltages to the memory cells of the selected memory cell set, the programming voltages being operable to program the memory cells of the set to a desired programming state having a value that is a function of the target values for the data bits.

18. The non-volatile memory device of claim 17 wherein the memory device comprises a FLASH memory device.

19. The non-volatile memory device of claim 17 wherein each memory cell is operable two data bits.

20. The page buffer of claim 17 further comprising:
   a first latch circuit adapted to receive and latch the target value for a first data bit group within the selected memory cell set;
   a second latch circuit adapted to receive and latch the target value for a second data bit group;
   an enabling circuit operable to enable the application to the memory cells of the selected memory cell set program pulses depending on the target values for both the first and the second data bit groups.

21. An electronic system, comprising:
   an electronic subsystem including a non-volatile memory device, the non-volatile memory device including,
   at least one memory-cell matrix, the memory-cell matrix including a plurality of multi-level memory cells arranged in rows and columns and the memory cells being arranged in individually-selectable memory cell sets;
   an address decoder coupled to the matrix of memory cells and adapted to receive a memory address, the address decoder operable to decode the address and provide decoded row address signals to access corresponding memory cells in the array; and
   a page buffer coupled to the memory-cell matrix, the page buffer being operable to program the memory cells of a selected memory cell set to an initial programming state and to latch target values for the data bits to be stored in the memory cells of a selected memory cell set, and the page buffer further operable to applying a sequence of programming voltages to the memory cells of the selected memory cell set, the programming voltages being operable to program the memory cells of the set to a desired programming state having a value that is a function of the target values for the data bits.

22. The electronic system of claim 21 wherein the electronic subsystem comprises one of a computer system, personal digital assistant, cellular telephone, and digital camera containing the memory device.

* * * * *

UNITED STATES PATENT AND TRADEMARK OFFICE
CERTIFICATE OF CORRECTION

| | | |
|---|---|---|
| PATENT NO. | : 7,366,014 B2 | Page 1 of 2 |
| APPLICATION NO. | : 11/495876 | |
| DATED | : April 29, 2008 | |
| INVENTOR(S) | : Rino Micheloni, Luca Crippa and Roberto Ravasio | |

It is certified that error appears in the above-identified patent and that said Letters Patent is hereby corrected as shown below:

Column 33 Claim 1 Line 8 remove dash between state and jointly
Column 33 Claim 2 Line 12 remove dash between sequence and includes
Column 33 Claim 2 Line 13 remove dash between pulses and to and between cell and of
Column 33 Claim 2 Line 17 remove dash between bits and has
Column 33 Claim 3 Line 24 remove dash between cells and includes
Column 33 Claim 3 Line 25 remove dash after the word states
Column 33 Claim 3 Line 27 remove dash between state and corresponding
Column 33 Claim 3 Line 30 remove dash between state and corresponding
Column 33 Claim 4 Line 38 remove dash between voltage and applied
Column 33 Claim 4 Line 39 remove dash between cells and of
Column 33 Claim 4 Line 42 remove dash between state and of
Column 33 Claim 6 Line 50 remove dash between voltage and depending
Column 33 Claim 7 Line 54 remove dash between cell and of
Column 33 Claim 7 Line 55 remove dash between different and than
Column 33 Claim 7 Line 58 remove dash between voltage and adapted
Column 33 Claim 7 Line 59 remove dash between adjacent and to
Column 34 Claim 7 Line 1 remove dash between voltage and adapted
Column 34 Claim 7 Line 3 remove dash between state and has
Column 34 Claim 7 Line 11 remove dash between voltage and adapted
Column 34 Claim 7 Line 12 remove dash between state and has
Column 34 Claim 8 Line 13 remove dash between memory and including
Column 34 Claim 8 Line 14 remove dash between cells and arranged
Column 34 Claim 8 Line 17 remove dash between states and corresponding
Column 34 Claim 8 Line 25 remove dash between the and electrically
Column 34 Claim 8 Line 38 remove dash after state
Column 34 Claim 9 Line 41 remove dash between memory and of
Column 34 Claim 9 Line 44 remove dash between pulses and to and between cell and of
Column 34 Claim 9 Line 46 remove dash between state and thereof
Column 34 Claim 9 Line 51 remove dash between means and adapted
Column 34 Claim 9 Line 53 remove dash between means and adapted
Column 34 Claim 10 Line 60 remove dash between memory and of
Column 34 Claim 10 Line 63 remove dash between cells and of

UNITED STATES PATENT AND TRADEMARK OFFICE
CERTIFICATE OF CORRECTION

PATENT NO. : 7,366,014 B2
APPLICATION NO. : 11/495876
DATED : April 29, 2008
INVENTOR(S) : Rino Micheloni, Luca Crippa and Roberto Ravasio It is certified that error appears in the above-identified patent and that said Letters Patent is hereby corrected as shown below:

Column 34 Claim 11 Line 65 remove dash between memory and of
Column 35 Claim 12 Line 3 remove dash between memory and of Signed and Sealed this Twelfth Day of August, 2008

JON W. DUDAS
*Director of the United States Patent and Trademark Office*

UNITED STATES PATENT AND TRADEMARK OFFICE
CERTIFICATE OF CORRECTION

PATENT NO.       : 7,366,014 B2                                          Page 1 of 1
APPLICATION NO.  : 11/495876
DATED            : April 29, 2008
INVENTOR(S)      : Micheloni et al.

It is certified that error appears in the above-identified patent and that said Letters Patent is hereby corrected as shown below:

On the Title Page, Item (73) include the following Assignees:

Should read

STMicroelectronics, S.r.l.
Via C. Olivetti, 2, I-20041
Agrate Brianza (MI), ITALY Hynix Semiconductor, Inc.
San 136-1, Ami-Ri
Bubal-Eub, 467-701 - Ichon-Si
Kyoungki-Do, KOREA Signed and Sealed this Twenty-eighth Day of October, 2008

JON W. DUDAS
*Director of the United States Patent and Trademark Office*